(12) United States Patent
Masukawa et al.

(10) Patent No.: US 8,778,819 B2
(45) Date of Patent: Jul. 15, 2014

(54) DIELECTRIC CERAMIC COMPOSITION, MULTILAYER DIELECTRIC SUBSTRATE, ELECTRONIC COMPONENT, AND METHOD FOR PRODUCING DIELECTRIC CERAMIC COMPOSITION

(75) Inventors: Junichi Masukawa, Tottori (JP); Koji Ichikawa, Saitama (JP)

(73) Assignee: Hitachi Metals, Ltd., Tokyo (JP)

( * ) Notice: Subject to any disclaimer, the term of this patent is extended or adjusted under 35 U.S.C. 154(b) by 231 days.

(21) Appl. No.: 13/260,060

(22) PCT Filed: Mar. 19, 2010

(86) PCT No.: PCT/JP2010/054792
§ 371 (c)(1),
(2), (4) Date: Sep. 23, 2011

(87) PCT Pub. No.: WO2010/110201
PCT Pub. Date: Sep. 30, 2010

(65) Prior Publication Data
US 2012/0015198 A1    Jan. 19, 2012

(30) Foreign Application Priority Data
Mar. 26, 2009   (JP) .................................. 2009-077027

(51) Int. Cl.
C03C 14/00   (2006.01)
C04B 35/465  (2006.01)
C04B 35/195  (2006.01)

(52) U.S. Cl.
USPC ............. 501/32; 501/128; 501/136; 428/210; 428/432; 428/434

(58) Field of Classification Search
USPC ............ 501/32, 134, 135, 136, 128; 428/210, 428/432, 434
See application file for complete search history.

(56) References Cited

U.S. PATENT DOCUMENTS

| | | | |
|---|---|---|---|
| 6,120,906 A | 9/2000 | Terashi | |
| 6,159,883 A * | 12/2000 | Lin et al. | 501/32 |
| 7,144,833 B2 * | 12/2006 | Umemoto et al. | 501/32 |
| 2004/0009863 A1 | 1/2004 | Furuse et al. | |
| 2005/0074590 A1 * | 4/2005 | Umemoto et al. | 428/209 |
| 2006/0100087 A1 | 5/2006 | Fukuta et al. | |

FOREIGN PATENT DOCUMENTS

| | | |
|---|---|---|
| JP | 9-20553 A | 1/1997 |
| JP | 11-130533 A | 5/1999 |
| JP | 2002-16165 A | 1/2002 |
| JP | 2002-167274 A | 6/2002 |
| JP | 2003-286074 A | 10/2003 |
| JP | 2004-196652 A | 7/2004 |
| JP | 2006-1755 A | 1/2006 |

OTHER PUBLICATIONS

International Search Report of PCT/JP2010/054792 dated Jun. 1, 2010.

* cited by examiner

*Primary Examiner* — Karl Group
(74) *Attorney, Agent, or Firm* — Sughrue Mion, PLLC

(57) ABSTRACT

Disclosed is a dielectric ceramic composition which has high dielectric constant and suppressed low thermal expansion coefficient. Also disclosed are a multilayer dielectric substrate using the dielectric ceramic composition, and an electronic component. Specifically disclosed is a dielectric ceramic composition which contains an $ATiO_3$ (wherein A represents either Ca and/or Sr) phase and an $AAl_2Si_2O_8$ phase, said dielectric ceramic composition being characterized in that the dielectric constant is not less than 10 at 3 GHz and the average thermal expansion coefficient over the temperature range of 40-600° C. is less than 7 ppm/° C.

18 Claims, 6 Drawing Sheets

DIELECTRIC CERAMIC COMPOSITION, MULTILAYER DIELECTRIC SUBSTRATE, ELECTRONIC COMPONENT, AND METHOD FOR PRODUCING DIELECTRIC CERAMIC COMPOSITION

CROSS REFERENCE TO RELATED APPLICATIONS

This application is a National Stage of International Application No. PCT/JP2010/054792, filed on Mar. 19, 2010, which claims priority from Japanese Patent Application No. 2009-077027, filed on Mar. 26, 2009, the contents of all of which are incorporated herein by reference in their entirety.

TECHNICAL FIELD

The present invention relates to a dielectric ceramic composition, a multilayer dielectric substrate, an electronic component, and a method for producing a dielectric ceramic composition, and particularly to a multilayer dielectric substrate produced by low temperature firing allowing for simultaneous firing of conductors and other dielectric layers.

BACKGROUND ART

In recent years, the miniaturization of electronic components has been demanded along with the progress of communication technologies utilizing electromagnetic waves in the microwave region, such as automobile telephones, cell phones and satellite broadcasting. In order to achieve the demand, individual components constituting electronic components need to be miniaturized.

Dielectric ceramic compositions are used, in these electronic components, as materials for dielectric resonators, filters, laminated inductors, laminated capacitors and high-frequency components obtained by compositing them. For example, the size of a dielectric resonator is inversely proportional to the square root of a dielectric constant of a dielectric material in the case of utilizing the same resonance mode. Therefore, in order to fabricate a small dielectric resonator, a dielectric material having a high dielectric constant is needed. With respect to properties of a dielectric material for the microwaves, it is required that the dielectric loss tan $\delta$ (=1/Q) in the microwave region is low, that is, the Q value is high, the temperature coefficient $\tau_f$ of the resonance frequency is as near to zero as possible, and so on.

It is further necessary that internal electrodes for dielectric resonators, filters, laminated inductors, laminated capacitors and the like used in the microwave region, and the like be composed of conductors having a low resistance loss in the microwave band, such as silver, copper and gold. In order to miniaturize these electronic components for the microwaves, laminated electronic components are used which are obtained by simultaneous firing of laminated structures of dielectric ceramic compositions and internal electrodes. In this case, in order to fire a conductor having a low melting point, such as silver (melting point: 961° C.), copper (melting point: 1,083° C.) or gold (melting point: 1,063° C.), simultaneously with a dielectric material, the dielectric material needs to be one to be sintered at a temperature of 1,000° C. or lower, and preferably 900° C. or lower.

Patent Document 1 describes a material capable of being fired simultaneously with a dielectric ceramic composition and an internal electrode material such as silver, copper or gold, in order to miniaturize electronic components for the microwaves.

A capacitor built-in substrate has been proposed recently in which a ceramic layer having different properties is interposed as a multilayer inside a laminated electronic component. The ceramic having different properties includes high dielectric constant materials and magnetic materials. For example, in order to miniaturize a capacitance element, a built-in capacitor obtained by combining high dielectric constant materials is effective. Patent Document 1 discloses a multilayer wiring board bringing out an electrostatic capacity by using a built-in high dielectric constant ceramic insulating layer.

Patent Document 1: JP 2002-167274 A

DISCLOSURE OF THE INVENTION

Problems to be Solved by the Invention

Although the conventional dielectric ceramic composition having an A'Al$_2$Si$_2$O$_8$ phase (A' is at least one of Ca, Sr and Ba) and an Al$_2$O$_3$ phase is a dielectric material excellent in dielectric properties and deflective strength, it has as low a thermal expansion coefficient as about 5 ppm/° C.

However, if a ceramic layer greatly different in the shrinkage behavior in firing and the thermal expansion coefficient is interposed inside, it causes the occurrence of delamination and cracks on each ceramic layer interface. In view of this, a ceramic composition disclosed in Patent Document 1 has the high thermal expansion coefficient of 7.0 ppm/° C. or higher. Thus, if this ceramic composition is fired simultaneously with a material having a thermal expansion coefficient of 5 ppm, the delamination, cracks and the like are liable to occur. Therefore, as a material interposed inside such a dielectric ceramic composition, the ceramic composition disclosed in Patent Document 1 is not suitable. Generally, an ATiO having a high dielectric constant ($\in$) has the high thermal expansion coefficient of 9 to 11 ppm/$\in$.

Thus, the object of the present invention is to provide a dielectric ceramic composition which has a high dielectric constant and is suppressed low in the thermal expansion coefficient, a multilayer dielectric substrate and an electronic component using the same, and further a method for producing the dielectric ceramic composition.

Means for Solving the Problems

The dielectric ceramic composition of the present invention is a dielectric ceramic composition containing an ATiO$_3$ (A is an element consisting of at least one of Ca and Sr) phase and an AAl$_2$Si$_2$O$_8$ phase, characterized by having the dielectric constant of 10 or higher at 3 GHz and the average thermal expansion coefficient of lower than 7 ppm/° C. in the temperature range of 40 to 600° C. The dielectric ceramic composition having the high dielectric constant, according to this constitution can be interposed inside a dielectric ceramic composition having an A'Al$_2$Si$_2$O$_8$ phase (A' is an element consisting of at least one of Ca, Sr and Ba) and an Al$_2$O$_3$ phase in the structure.

The dielectric ceramic composition of the present invention can contain, in addition to Al, Si, A and Ti as main components, B as an additional element; and the dielectric ceramic composition can be used which contains, with respect to 100 parts by weight of the whole of the dielectric ceramic composition, 11 to 25% by weight of the Al element in terms of Al$_2$O$_3$, 20 to 33% by weight of the Si element in terms of SiO$_2$, 5 to 30% by weight of the A element in terms of AO, 0.06 times Al (in terms of Al$_2$O$_3$) or more to 5% by weight of the B element in terms of $B_2O_3$, and $TiO_2$ (containing inevitable impurities) as the remainder.

It is preferable that in the case where the A element consists only of Sr, the Sr element in the whole of a dielectric ceramic composition is 5 to 30% by weight in terms of SrO and that in the case where the A element further contains Ca, the Sr element in the whole of a dielectric ceramic composition is 5 to 15% by weight in terms of SrO, and the total of the Sr and Ca elements in the whole of the dielectric ceramic composition is 5 to 30% by weight in terms of AO.

The dielectric ceramic composition of the present invention can contain at least one of R (R is an element consisting of at least one of Nd, La and Sm), Mg and Zn; and the dielectric ceramic composition is preferable which contains, with respect to 100 parts by weight of the whole of the dielectric ceramic composition, 0.01 to 20% by weight of the R element in terms of $R_2O_3$, 0 to 10% by weight of the Mg element in terms of MgO, and/or 0 to 5% by weight of the Zn element in terms of ZnO.

The dielectric ceramic composition of the present invention can contain at least one of Na, K, Cu, Mn and Bi; and the dielectric ceramic composition is preferable which contains, with respect to 100 parts by weight of the whole of the dielectric ceramic composition, 0 to 4% by weight of the Na element in terms of $Na_2O$, 0 to 1% by weight of the K element in terms of $K_2O$, 0.1 to 3% by weight of the Cu element in terms of CuO, 0.1 to 3% by weight of the Mn element in terms of $Mn_3O_4$, and/or 1 to 5% by weight of the Bi element in terms of $Bi_2O_3$.

By the additional elements satisfying the above-mentioned compositional range, a dielectric ceramic composition can be obtained in which the absolute value of the temperature coefficient $\tau_f$ of the resonance frequency in the temperature range of $-20°$ C. to $60°$ C. is 120 ppm/$°$ C. or lower.

The dielectric ceramic composition of the present invention can contain Ag; and a dielectric ceramic composition is preferable which contains, with respect to 100 parts by weight of the whole of the dielectric ceramic composition, 0.1 to 3% by weight of Ag.

By setting the dielectric ceramic composition of the present invention to have the above-mentioned composition range, a dielectric ceramic composition can be obtained in which no phase of R-M-Ti—Si—O type (R is an element consisting of at least one of Nd, Sm and La; and M is an element consisting of at least one of Mg and Zn) or no phase of A-Ti—Si—O type (A is an element consisting of at least one of Ca and Sr) substantially exists.

As the dielectric ceramic composition of the present invention, a dielectric ceramic composition can be obtained which contains not only an $ATiO_3$ phase but also at least one compound phase of $R_{2/3}TiO_3$ (R is an element consisting of at least one of Nd, La and Sm) and $M_2TiO_4$ (M is an element consisting of at least one of Mg and Zn).

A multilayer dielectric substrate in which a plurality of dielectric layers on which conductors are formed is integrally laminated can be obtained wherein the multilayer dielectric substrate is constituted using any one of the above-mentioned dielectric ceramic compositions as at least one dielectric layer of the plurality of dielectric layers and constituted using a dielectric ceramic composition having an $A'Al_2Si_2O_8$ phase (A' is an element consisting of at least one of Ca, Sr and Ba) and an $Al_2O_3$ phase as the other dielectric layer(s). In the dielectric ceramic composition having the $A'Al_2Si_2O_8$ phase and the $Al_2O_3$ phase, monoclinic crystals and hexagonal crystals exist, and they become monoclinic crystals after a firing.

A dielectric layer having the above-mentioned monoclinic crystal $A'Al_2Si_2O_8$ phase and $Al_2O_3$ phase contains Al, Si, A' (A' is an element consisting of at least one of Ca, Sr and Ba) and Ti as main components, and at least one selected from the group consisting of Bi, Na, K and Co as accessory components, and further at least one selected from the group consisting of Cu, Mn and Ag, wherein the dielectric layer contains Al, Si, A' and Ti as the main components in the following ratio: with respect to 100 parts by weight of the whole of a dielectric ceramic composition, 10 to 60% by weight of Al in terms of $Al_2O_3$, 25 to 60% by weight of Si in terms of $SiO_2$, 7.5 to 50% by weight of A' in terms of NO and 20% by weight or less (including 0) of Ti in terms of $TiO_2$; and contains at least one selected from the group consisting of Bi, Na, K and Co as the accessory components in the following ratio: with respect to 100 parts by weight of the main components, 0 to 10% by weight of Bi in terms of $Bi_2O_3$, 0 to 5% by weight of Na in terms of $Na_2O$, 0 to 5% by weight of K in terms of $K_2O$ and/or 0 to 5% by weight of Co in terms of CoO; and further contains at least one selected from the group consisting of Cu, Mn and Ag in the following ratio: with respect to 100 parts by weight of the main components, 0 to 5% by weight of Cu in terms of CuO, 0 to 5% by weight of Mn in terms of $MnO_2$ and/or 0 to 5% by weight of Ag.

An electronic component can be produced using the multilayer dielectric substrate.

A method for producing a dielectric ceramic composition is not especially limited to the following, but a producing method can be employed which includes the steps of: preparing raw materials essentially containing Al, Si, Sr, Ti and B, and as required, containing at least one of Na, K, Cu, Mn, Bi and Ag, and calcining the prepared raw materials at the temperature of $600°$ C. or higher and $850°$ C. or lower to obtain a low temperature sintering component; separately preparing raw materials essentially containing the A element and Ti, and as required, containing an element consisting of at least one of Nd, La, Sm, Mg and Mn, and calcining the prepared raw materials at the temperature of higher than $700°$ C. and $1,300°$ C. or lower to obtain an inorganic filler component; and mixing the low temperature sintering component and the inorganic filler component, and thereafter, firing the mixture at a temperature higher than the calcining temperature of the low temperature sintering component and lower than the calcining temperature of the inorganic filler component.

The low temperature sintering component contains each of at least Al, Si, Sr and B; and the low temperature sintering component is preferable which has, when sintered, a composition containing, with respect to 100 parts by weight of the whole of the low temperature sintering component, 18 to 40% by weight of Al in terms of $Al_2O_3$, 40 to 58% by weight of Si in terms of $SiO_2$, 10 to 40% by weight of Sr in terms of SrO and 1.5 to 5% by weight of B in terms of $B_2O_3$.

The low temperature sintering component contains an element consisting of at least one selected from the group of Na, K, Cu, Mn and Bi; and the low temperature sintering component is preferable which has, when sintered, a composition containing, with respect to 100 parts by weight of the whole of the low temperature sintering component, 0 to 5% by weight of Na in terms of $Na_2O$, 0 to 5% by weight of K in terms of $K_2O$, 0.01 to 5% by weight of Cu in terms of CuO, 0.01 to 5% by weight of Mn in terms of $MnO_2$, and/or 0.1 to 5% by weight of Bi in terms of $Bi_2O_3$.

The low temperature sintering component preferably contains 0.5 to 6% by weight of Ag with respect to 100 parts by weight of the whole of the low temperature sintering component.

The inorganic filler component contains each of at least A (A is an element consisting of at least one of Ca and Sr) and Ti; and the inorganic filler component is preferable which has, when sintered, a composition containing, with respect to 100 parts by weight of the whole of the inorganic filler component, 10 to 60% by weight of A in terms of AO, and 30 to 60% by weight of Ti in terms of $TiO_2$.

The inorganic filler component contains at least one of R (R is an element consisting of at least one of Nd, La and Sm), Mg and Zn; and the inorganic filler component is preferable which has, when sintered, a composition containing, with respect to 100 parts by weight of the whole of the inorganic filler component, 0.01 to 50% by weight of R in terms of $R_2O_3$, 0 to 15% by weight of Mg in terms of MgO and 0 to 10% by weight of Zn in terms of ZnO.

Advantages of the Invention

The present invention can provide a dielectric ceramic composition which has a high dielectric constant and is suppressed low in the thermal expansion coefficient. The present invention can further provide a dielectric ceramic composition which is suppressed low in the temperature coefficient $\tau_f$ of the resonance frequency at −20 to 60° C.

The present invention can further provide a multilayer dielectric substrate using the dielectric ceramic composition and an electronic component using the dielectric ceramic composition.

The present invention can further provide a preferable producing method for obtaining the dielectric ceramic composition.

EMBODIMENTS FOR CARRYING OUT THE INVENTION

Figure 1:
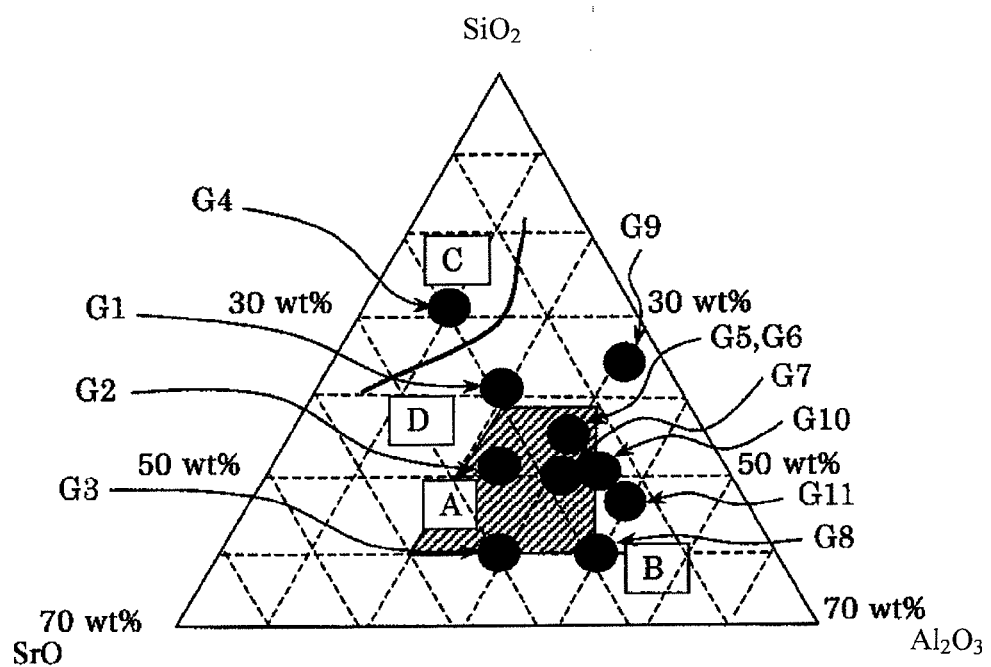
FIG. 1 is a diagram showing a composition of a low temperature sintering component constituting a dielectric ceramic composition.

Hereinafter, the present invention will be described specifically by way of Examples, but the present invention is not limited to these Examples.

The dielectric ceramic composition of the present invention is mainly composed of a low temperature sintering component and an inorganic filler component. The low temperature sintering component is a glass component capable of crystallizing an $AAl_2Si_2O_8$ phase as a crystal phase after firing. Crystallization of an $AAl_2Si_2O_8$ phase as a crystal phase after firing can provide a dielectric ceramic composition having a high strength, a high quality factor (Q value) at 1 to 5 GHz, and a low thermal expansion coefficient at 40 to 600° C. The low temperature sintering component used in the present invention contains A, Al and Si as main components and further B, and if necessary, contains an element consisting of at least one of Na, K, Cu, Mn, Bi and Ag.

On the other hand, the inorganic filler contains an $ATiO_3$ (A is an element consisting of at least one of Ca and Sr) phase. Since such an $ATiO_3$ phase has a high dielectric constant (in $CaTiO_3$, $\in=280$; in $SrTiO_3$, $\in=170$), the dielectric constant of the dielectric ceramic composition of the present invention containing an $ATiO_3$ phase can be made 10 or higher, and a capacitance element having a low dielectric constant can be miniaturized. An inorganic filler component used in the present invention contains, as a main composition, an A element consisting of at least one of Sr and Ca, and Ti, and if necessary, contains a rare earth element consisting of at least one of Nd, La and Sm, and elements of Mg and Zn.

The dielectric ceramic composition of the present invention uses a mixture of the low temperature sintering component and the inorganic filler component, and thereby a dielectric ceramic composition containing an $ATiO_3$ phase and an $AAl_2Si_2O_8$ phase can be made so as to be capable of being fired at a temperature of 1,000° C. or lower as well as so as to have the dielectric constant of 10 or higher in the frequency range of 1 GHz to 5 GHz, especially in the frequency of 3 GHz and a thermal expansion coefficient of lower than 7 ppm/° C. in the temperature range of 40 to 600° C.

The dielectric ceramic composition of the present invention uses, as the low temperature sintering component, 50 to 80% by weight of a glass component capable of crystallizing an $AAl_2Si_2O_8$ phase after firing, and can thereby suppress the diffusion of the components when a laminated body which is integrated with a dielectric ceramic composition having an $A'Al_2Si_2O_8$ phase and an $Al_2O_3$ phase is made, and can also suppress decreases in dielectric properties of the dielectric ceramic composition of the present invention. The dielectric ceramic composition of the present invention, because of having a thermal expansion coefficient of lower than 7 ppm/° C., can suppress the occurrence of cracks when a laminated body formed by integrating the dielectric ceramic composition according to the present invention with the dielectric ceramic composition having an $A'Al_2Si_2O_8$ phase and an $Al_2O_3$ phase is made. Since the dielectric ceramic composition having an $A'Al_2Si_2O_8$ phase and an $Al_2O_3$ phase in its structure has the dielectric constant of about 8 in the frequency range of 1 GHz to 5 GHz, a capacitance element can be miniaturized by setting the dielectric constant of the dielectric ceramic composition according to the present invention to have 10 or higher at 3 GHz and by interposing the dielectric ceramic composition according to the present invention inside the dielectric ceramic composition having an A'Al$_2$Si$_2$O$_8$ phase and an Al$_2$O$_3$ phase in its structure. The low temperature sintering component desirably has, as a single material, the dielectric constant of 5 or higher, a quality factor (fQ value) of 500 or higher at 1 to 5 GHz, a temperature coefficient $\tau_f$ of the resonance frequency of 200 ppm/° C. or lower at −20 to 60° C., and a thermal expansion coefficient of 7.0 ppm/° C. or lower at 40 to 600° C. When the low temperature sintering component is calcined as a single material, the AAl$_2$Si$_2$O$_8$ phase becomes almost a SrAl$_2$Si$_2$O$_8$ phase.

The low temperature sintering component varies the properties depending on the ratio of three components of SrO, Al$_2$O$_3$ and SiO$_2$. The low temperature sintering component is desirably in a compositional region surrounded by lines obtained by connecting the following points: a point of 58% by weight SiO$_2$, 10% by weight of SrO and 32% by weight of Al$_2$O$_3$; a point of 58% by weight of SiO$_2$, 24% by weight of SrO and 18% by weight of Al$_2$O$_3$; a point of 40% by weight SiO$_2$, 40% by weight of SrO and 20% by weight of Al$_2$O$_3$; and a point of 40% by weight of SiO$_2$, 20% by weight of SrO and 40% by weight of Al$_2$O$_3$, in FIG. 1. A composition in such a range is easy to be highly densified than a composition around a region of (B) when held at 900° C. for 2 hours. By contrast, a composition around a region of (D) hardly produces a SrAl$_2$Si$_2$O$_8$ phase. A composition around regions of (C) and (D) easily reacts with an inorganic filler.

B is an element exhibiting an effect on sinterability, and is preferably contained in the ratio of 1.5 to 5% by weight.

Therefore, the composition of a low temperature sintering component used in the present invention is preferably a composition containing, as each of at least Al, Si, Sr and B, 18 to 40% by weight of Al in terms of Al$_2$O$_3$, 40 to 58% by weight of Si in terms of SiO$_2$, 10 to 40% by weight of Sr in terms of SrO, and 1.5 to 5% by weight of B in terms of B$_2$O$_3$. Especially, B is a powerful element permitting a low temperature firing as a single material, and is an element essential in the present invention.

The Al amount is preferably 20 to 35% by weight, and more preferably 22 to 33% by weight, in terms of Al$_2$O$_3$.

The Si amount is preferably 42 to 55% by weight, and more preferably 43 to 50% by weight, in terms of SiO$_2$.

The Sr amount is preferably 12 to 35% by weight, and more preferably 13 to 30% by weight, in terms of SrO.

The B amount is preferably 1.2 to 4.5% by weight, and more preferably 1.3 to 4.0% by weight, in terms of B$_2$O$_3$.

From the viewpoint of the further improvement in sinterability, the additions of 0 to 5% by weight of Na$_2$O, 0 to 5% by weight of K$_2$O, 0.01 to 5% by weight of CuO, 0.01 to 5% by weight of Mn$_3$O$_4$, and 0.1 to 5.0% by weight of Bi$_2$O$_3$ are desirable. This is because if the additive amounts of Cu, Mn and Bi are less than the respective ranges, no effect of the improvement in sinterability is substantially exhibited; and if the addition amounts of the elements exceed the respective ranges, the dielectric properties decrease. Na is an element capable of carrying out a low temperature sintering as a simple substance, and is a useful element when is solely added to the low temperature sintering composition. The composite addition of CuO and Bi$_2$O$_3$ exhibits a remarkable effect on a low temperature sintering.

Further, the additive amounts are preferable in which Na$_2$O is 0.1 to 4.5% by weight, K$_2$O is 0.1 to 3% by weight, CuO is 0.1 to 4% by weight, Mn$_3$O$_4$ is 0.1 to 3% by weight and Bi$_2$O$_3$ is 0.1 to 4.5% by weight; and the additive amounts are more preferable in which Na$_2$O is 1 to 4.0% by weight, K$_2$O is 0.2 to 2% by weight, CuO is 0.2 to 2% by weight, Mn$_3$O$_4$ is 0.2 to 2% by weight and Bi$_2$O$_3$ is 1 to 4.0% by weight.

Further, the low temperature sintering component preferably includes 0.5 to 6% by weight of Ag with respect to 100 parts by weight of the whole of the low temperature sintering component. The inclusion of Ag decreases the occurrence rate of cracks and can improve the yield ratio in firing when simultaneous firing with the other dielectric layer(s) is carried out as described later. The low temperature sintering effect is also obtained.

The low temperature sintering component is preferably calcined at 600° C. or higher and 850° C. or lower. In the range of the temperature of lower than 600° C., the degree of vitrification is insufficient; and in the range of the temperature of more than 850° C., the sintering density becomes too high, and thus it is difficult to finely pulverize the calcined material; and even if the calcined material is thereafter mixed and fired with a calcined powder of an inorganic filler component, a desired thermal expansion coefficient is difficult to obtain. A low temperature firing also becomes difficult.

In the low temperature sintering component composed of the above-mentioned composition, there are substantially no SiO$_2$ phase and SrSiO$_3$ phase. Even if the XRD analysis (using a Cu-Kα tube at voltage of 40 kV and current of 100 mA) in the state of a sintered body is carried out, these phases are not detected; and the peak value of the SiO$_2$ phase observed in the vicinity of 22° and the peak value of the SrSiO$_3$ phase observed in the vicinity of 31° have heights $\frac{1}{10}$ or less times the maximum peak value in the vicinity of 28° of a Sr feldspar (SrAl$_2$SiO$_2$O$_8$ phase).

An inorganic filler component contains an ATiO$_3$ (A is an element consisting of at least one of Ca and Sr) phase. In order to obtain this phase, it is desirable that the inorganic filler component contains each of the A element and Ti, and has a composition containing, with respect to 100% by weight of the whole of the inorganic filler component, 10 to 60% by weight of AO in terms of AO and 30 to 60% by weight of TiO$_2$ in terms of TiO$_2$. In the case where the A element is Ca, Ca is preferably 10 to 45% by weight in terms of CaO. An increase in the thermal expansion coefficient can be suppressed by setting the Ca additive amount to be 60% by weight or less. In the case where the A element is Sr, Sr is desirably 15 to 60% by weight. An increase in the temperature coefficient $\tau_f$ of the resonance frequency can be suppressed by setting the additive amount of Sr to be 60% by weight or less.

In order to lower the temperature coefficient $\tau_f$ of the resonance frequency, the addition of 0.01 to 50% by weight of a rare earth element R (R is an element consisting of at least one of Nd, La and Sm) is preferable. In the case where a rare earth element which is added to the inorganic filler component is Nd, Nd$_2$O$_3$ is preferably in 1 to 36% by weight. In the case where the rare earth element which is added thereto is La or Sm, La$_2$O$_3$ or Sm$_2$O$_3$ is preferably in 1 to 40% by weight. MgO is desirably added thereto in the range of 0 to 15% by weight; and ZnO, in the range of 0 to 10% by weight. As long as these compositions do not exceed these ranges, a decrease in the dielectric constant can be suppressed as much as possible.

In order to acquire the dielectric constant of 10 or higher, carry out the firing at a temperature higher than the calcination temperature of a low temperature sintering component and lower than the calcination temperature of an inorganic filler, and achieve high densification (density saturation), as described above, the low temperature sintering component and the inorganic filler component are desirably blended in a proportion of 40 to 80:20 to 60 in percentage (%) by weight. If the low temperature sintering component is less than 40% by weight and an inorganic filler component is more than 60% by weight, a good densified body is difficult to be obtained in the temperature region to integrate with a dielectric ceramic composition having Ag, an A'Al$_2$Si$_2$O$_8$ phase (A' is an element consisting of at least one of Ca, Sr and Ba) and an Al$_2$O$_3$ phase by a one-time firing process. In the case where the low temperature sintering component is more than 80% by weight and an inorganic filler component is less than 20% by weight, the dielectric constant as a sintered body is difficult to be enhanced. The temperature of the firing after the mixing is preferably higher than 750° C. and lower than 1,100° C. The holding time of the sintering temperature is preferably 0.1 to 100 hours, more preferably 0.5 to 10 hours, and still more preferably 1 to 5 hours. If the holding time of the sintering is short, the low temperature sintering component and an inorganic filler component are not sufficiently sintered. If the holding time is long conversely, additional elements in the inorganic filler side diffuse into the low temperature sintering component side, and desired dielectric properties cannot be acquired.

By calcining raw materials of an inorganic filler component at 600° C. or higher, the temperature of the firing after mixing the inorganic filler component with the low temperature sintering component can be reduced. Even though the mixed materials are fired, a porous fired body having voids is liable to be made as long as the temperature for the calcination is lower than 600° C., resulting in defects in sinterability. The temperature is preferably 650° C. or higher, and more preferably 700° C. or higher.

It is more preferable that an inorganic filler component is calcined at a temperature of higher than 850° C. and 1,300° C. or lower. If the calcination temperature is higher than 850° C., the firing temperature can be set to 1,000° C. or lower, and further 950° C. or lower. If the calcination temperature exceeds 1,300° C., the reaction with a reaction vessel in calcination is enhanced to cause incorporation of impurity elements, and fine pulverization becomes difficult. Thus, even though the calcined material is thereafter mixed and fired with a calcined powder of a low temperature sintering component, a porous sintered body having voids is liable to be made, resulting in defects in sinterability. The calcination temperature is still more preferably 1,200° C. or lower.

After a low temperature sintering component and an inorganic filler component are mixed to obtain the dielectric ceramic composition of the present invention as described above, the dielectric ceramic composition is formed into a substrate form. The details will be described later.

The firing can be carried out simultaneously with a ceramic green sheet using the other dielectric body(ies).

The simultaneous firing (the firing) is carried out at a temperature higher than the calcination temperature of a low temperature sintering component and lower than the calcination temperature of an inorganic filler component. If the firing temperature is lower than the calcination temperature of the low temperature sintering component, the bond with the other dielectric layer(s) having a similar sintering temperature is not achieved. Thus, the lamination and integration cannot be achieved. By contrast, if the firing temperature is higher than the calcination temperature of an inorganic filler component, the temperature is a temperature equal to or higher than the melting point of a Ag conductor paste, and thus the Ag paste melts and flows. As the result, desired elements and electrodes cannot be formed in a laminate.

The preferable firing temperature is, although influenced by a composition of the another dielectric layer, higher than 850° C. and lower than 1,000° C.

In order to crystallize an AAl$_2$Si$_2$O$_8$ phase, make the dielectric constant to be 10 or higher at 3 GHz, and further make the thermal expansion coefficient in the temperature range of 40 to 600° C. to be lower than 7 ppm/° C., a composition of the dielectric ceramic composition including a low temperature sintering component and an inorganic filler component of the present invention contains Al, Si, A and Ti as main components and B as an additional element, the composition preferably containing 11 to 25% by weight of an Al element in terms of Al$_2$O$_3$, to 33% by weight of the Si element in terms of SiO$_2$, 5 to 30% by weight of the A element in terms of AO, 0.06 times Al (in terms of Al$_2$O$_3$) or more to 5% by weight of the B element in terms of B$_2$O$_3$, and TiO$_2$ (containing inevitable impurities) as the remainder.

If B is added to a dielectric ceramic composition to crystallize an AAl$_2$Si$_2$O$_8$ phase, the sinterability can be improved while the decrease in the dielectric constant is suppressed as much as possible.

A more preferable composition is 11.5 to 23% by weight of an Al element in terms of Al$_2$O$_3$, 22 to 32% by weight of the Si element in terms of SiO$_2$, 7 to 29% by weight of the A element in terms of AO, 1.0 to 2.5% by weight of the B element in terms of B$_2$O$_3$, and TiO$_2$ (containing inevitable impurities) as the remainder; and a still more preferable composition is 12.0 to 20% by weight of the Al element in terms of Al$_2$O$_3$, 24 to 31% by weight of the Si element in terms of SiO$_2$, 7 to 28% by weight of the A element in terms of AO, 1.3 to 2% by weight of the B element in terms of B$_2$O$_3$, and TiO$_2$ (containing inevitable impurities) as the remainder.

If the Al amount is low, an R-M-Ti—Si—O type phase is generated in a dielectric ceramic composition, and the thermal expansion coefficient is liable to be raised. By contrast, if the Al amount is large, the sintarability is influenced and cracks and delamination are liable to occur.

If the amount of an A element (an element consisting of at least one of Ca and Sr), especially Sr, is small, not a Sr feldspar but a phase different from the AAl$_2$Si$_2$O$_8$ phase emerges in the sintering process and the thermal expansion coefficient is liable to become large. By contrast, if the A element amount is large, the absolute value of the temperature coefficient $\tau_f$ of the resonance frequency cannot be made small. Even if the A element amount is large, a feldspar deposits rising of $\tau_f$ does not always occur as long as the Ti amount is low. However, in the case where the Sr element exceeds 15% by weight, it is preferable to set the ratio of Sr to Ti in terms of SrO/TiO$_2$ to be 1.5 or more.

In the case where the A element consists only of Sr, the Sr element is preferably 5 to 30% by weight in terms of SrO. In order to improve the temperature coefficient $\tau_f$ of the resonance frequency, both Sr and Ca are preferably contained in the whole of a dielectric ceramic composition. In this case, it is more preferable that 5 to 15% by weight of Sr is contained in terms of SrO and the total of SrO and CaO is 5 to 30% by weight. It is preferable that Ca is contained in the range of 3 to 18% by weight in terms of CaO.

By setting the Sr amount and the Ca amount to be the above-mentioned ranges, a dielectric ceramic composition having a high dielectric constant, a low thermal expansion coefficient and high sinterability can be more easily obtained.

The addition of Nd, La and/or Sm to the above-mentioned composition makes a phase of RTiO$_3$ (R is an element consisting of at least one of Nd, La and Sm). The addition of Mg and/or Zn to the above-mentioned composition makes a phase of M$_2$TiO$_4$ (M is an element consisting of at least one of Mg and Zn). By containing at least one of these, the absolute value of the temperature coefficient $\tau_f$ of the resonance frequency can be reduced. For example, the absolute value of the temperature coefficient $\tau_f$ of the resonance frequency at −20 to 60° C. of the dielectric ceramic composition of the present invention can be made 100 ppm/° C. or lower, and thus the dielectric ceramic composition can be provided for electronic components requiring the temperature stability.

The addition of Nd can most easily reduce the temperature coefficient $\tau_f$. A dielectric ceramic composition preferably contains, as at least one of Nd, La, Sm, Mg and Zn, with respect to 100 parts by weight of the whole of the dielectric ceramic composition, 0.1 to 20% by weight of Nd in terms of $Nd_2O_3$, 0 to 12% by weight of La in terms of $La_2O_3$, 0 to 12% by weight of Sm in terms of $Sm_2O_3$, 0 to 10% by weight of Mg in terms of MgO, and/or 0 to 5% by weight of Zn in terms of ZnO. A more preferable Nd amount is 1 to 18% by weight in terms of $Nd_2O_3$. However, since rare earth elements are constantly expensive, Mg and/or Zn relatively having price fluctuation may be used to reduce the temperature coefficient $\tau_f$, or a rare earth and Mg and/or Zn may be composited and used.

Additionally, the dielectric ceramic composition of the present invention preferably contains, as at least one of Na, K, Cu, Mn and Bi, with respect to 100 parts by weight of the whole of the dielectric ceramic composition, 0 to 4% by weight of Na in terms of $Na_2O$, 0 to 1% by weight of K in terms of $K_2O$, 0.1 to 3% by weight of Cu in terms of CuO, 0.1 to 3% by weight of Mn in terms of $Mn_3O_4$, and/or 1 to 5% by weight of Bi in terms of $Bi_2O_3$. These accessory components have an effect of making the dielectric ceramic composition of a lower melting point. Further, CuO and $Mn_3O_4$ have an effect of promoting crystallization of the Sr feldspar.

The dielectric ceramic composition preferably contains 0.1 to 3% by weight of Ag with respect to 100 parts by weight of the whole of the dielectric ceramic composition. In the case where the other dielectric layer(s) contains Ag, cracks generated by the simultaneous firing of the layer can be suppressed. In the case where a conductor composed of Ag or Ag alloy paste is used on a dielectric layer using the dielectric ceramic composition, the migration can be suppressed.

A dielectric ceramic composition composed of the above-mentioned composition has a feature in which no R-M-Ti—Si—O type (R is an element consisting of at least one of Nd, Sm and La, and M is an element consisting of at least one of Mg and Zn) phase and no A-Ti—Si—O type (A is an element consisting of at least one of Ca and Sr) phase is substantially exists. The R-M-Ti—Si—O type phase corresponds to, for example, an $M_2R_4Ti_3Si_4O_{22}$ phase. The A-Ti—Si—O type phase corresponds to, for example, a $CaTiSiO_5$ phase or a $Sr_2TiSi_2O_8$ phase. If the R-M-Ti—Si—O type phase remains, the thermal expansion coefficient is liable to increase; and if the A-Ti—Si—O type phase remains, the quality factor fQ is liable to worsen.

Even if the XRD analysis (using a Cu-Kα tube at voltage of 40 kV and current of 100 mA) in the state of a sintered body is carried out, this phase is not detected; and the peak value of the R-M-Ti—Si—O type phase observed in the vicinity of 30° has a height 1/10 or less times the maximum peak value in the vicinity of 33° of an $AAl_2SiO_2O_8$ phase including a Sr feldspar (i.e. an intensity ratio of 10% or less).

The multilayer dielectric substrate according to the present invention is a multilayer dielectric substrate in which a plurality of dielectric layers on which conductors are formed is integrally laminated. At least one dielectric layer of the plurality of dielectric layers is constituted by using the above-mentioned dielectric ceramic composition according to the present invention (such a dielectric layer is also referred to as a high dielectric constant layer), and the other dielectric layer(s) is constituted by using a dielectric ceramic composition having a monoclinic $AAl_2Si_2O_8$ phase and an $Al_2O_3$ phase (such a dielectric layer is also referred to as a low dielectric constant layer). A capacitance element built in a multilayer dielectric substrate can be miniaturized by interposing a high dielectric constant layer between electrodes opposing to each other. The high dielectric constant layer may consist of one layer or a plurality of layers. In short, in the case where the high dielectric constant layer consists of one layer, it is preferable that the high dielectric constant layer is arranged nearly at the center in the lamination direction; and in the case where the high dielectric constant layer consists of a plurality of layers, the high dielectric constant layers are arranged separately on both sides of the center in the lamination direction (upper side and lower side). In the case where the high dielectric constant layer consists of a plurality of layers, it is more preferable that the high dielectric constant layers be arranged at positions of the same order from the upper surface and the lower surface.

The dielectric ceramic composition having an $AAl_2Si_2O_8$ phase and an $Al_2O_3$ phase, which is mentioned above includes a dielectric ceramic composition composed of finely pulverized particles having an average particle diameter of 0.6 to 2 μm prepared by once calcining a mixture at 700° C. to 850° C. and pulverizing the calcined mixture, wherein the mixture contains, for example, as each of Al, Si, Sr and Ti as main components, 10 to 60% by weight of Al in terms of $Al_2O_3$, 25 to 60% by weight of Si in terms of $SiO_2$, 7.5 to 50% by weight of Sr in terms of SrO, and 20% by weight or less (including 0) of Ti in terms of $TiO_2$; contains, as at least one selected from the group consisting of Bi, Na, K and Co as accessory components, with respect to 100 parts by weight of the main components, 0 to 10% by weight of Bi in terms of $Bi_2O_3$, 0 to 5% by weight of Na in terms of $Na_2O$, 0 to 5% by weight of K in terms of $K_2O$ and/or 0 to 5% by weight of Co in terms of CoO; and further contains, as at least one selected from the group consisting of Cu, Mn and Ag, with respect to 100 parts by weight of the main components, 0 to 5% by weight of Cu in terms of CuO, 0 to 5% by weight of Mn in terms of $Mn_3O_4$ and/or 0 to 5% by weight of Ag; and contains inevitable impurities. In the case where the other dielectric ceramic composition having an $AAl_2Si_2O_8$ phase and an $Al_2O_3$ phase contains 0.01 to 5% by weight of Ag, it is preferable that Ag is also added to the dielectric ceramic composition of the present invention.

The preferable additive amount of at least one element selected from the group consisting of Bi, Na, K and Co is 0.1 to 8% by weight of Bi in terms of $Bi_2O_3$; 0.1 to 4% by weight of Na in terms of $Na_2O$; 0.1 to 3% by weight of K in terms of $K_2O$ and/or 0.1 to 3% by weight of Co in terms of CoO, and the preferable additive amount of at least one element selected from the group consisting of Cu, Mn and Ag is 0.01 to 3% by weight of Cu in terms of CuO; 0.01 to 3% by weight of Mn in terms of $MnO_2$ and/or 0.01 to 3% by weight of Ag. Especially, Bi has an effect on a low temperature firing.

(Production of a Multilayer Dielectric Substrate)

In a process of forming a multilayer dielectric substrate, first, a plurality of high dielectric constant green sheets which are composed of the dielectric ceramic composition of the present invention is produced. For example, a slurry composed of a powder of the dielectric ceramic composition, an organic binder, a plasticizer and a solvent is formed into a film having a predetermined thickness on an organic carrier film (for example, PET film) by a doctor blade method, and dried. The thickness of the dielectric ceramic composition slurry after the drying is suitably designed to a preferable thickness for making the multilayer dielectric substrate as a capacitor built-in substrate.

Further, a plurality of low dielectric constant green sheets composed of the other dielectric layer(s) is produced. Slurry composed of the mixture of a powder of the dielectric ceramic composition having an $AAl_2Si_2O_8$ phase and an $Al_2O_3$ phase, a powder of a glass component, an organic binder, a plasticizer and a solvent is formed into a film having a predetermined thickness on an organic carrier film by a doctor blade method, and dried. The thickness of the slurry of the other dielectric layer(s) after the drying is, depending on the thickness of the multilayer dielectric substrate, the circuit arrangement and the like, generally 20 to 200 μm.

The production of the high dielectric constant green sheet and the low dielectric constant green sheet is not limited to the doctor blade method as described above, and the production may be carried out, for example, by a rolling (extrusion) method, a printing method, an inkjet type coating method, a transfer method or the like. In this case, the high dielectric constant green sheet and the low dielectric constant green sheet form a ceramic green sheet with a carrier film integrally produced on the thin carrier film such as PET film. Then, the ceramic green sheet is cut as it is without peeling off the carrier film, to obtain a plurality of green sheets. Although handling in the form of a green sheet is easy, a producing method of repeatedly reeling in/out a non cut green sheet in the form of a roll and thereby supplying to the subsequent process such as printing is also a rational producing method.

In each of the high dielectric constant green sheet with a carrier film and the low dielectric constant green sheet with a carrier film, via holes are formed using a laser according to a target circuit. Thereafter, a conductor paste containing silver (Ag) as a main component is put on each via hole through a printing screen, and pressed into the via hole by a squeegee; and excessive conductor paste is peeled off to fabricate via electrodes 5. In this case, every green sheet is mounted on a support table of a printing apparatus to carry out a printing and filling process of via electrodes so that the green sheet is on the printing screen side and the carrier film is on the support table side. On the surface of each green sheet containing a low dielectric constant green sheet 2a of the upper surface, electrode patterns 4 corresponding to a target circuit are formed in a thickness of 5 to 35 μm by printing using a conductor paste such as silver (Ag). These electrode patterns 4 form the internal wiring of inductors, transmission lines, capacitors, ground electrodes and the like, which are mutually connected through a via wiring from the via electrodes to constitute the target circuit wiring.

Then, the high dielectric constant green sheets and the low dielectric constant green sheets on which via electrodes and/or conductor patterns are formed are suitably laminated. The high-dielectric constant green sheets 3a, 3b, 3c and 3d make, in many cases, layers on which capacitors are formed, and they are usually layers of the middle portion of a multilayer dielectric substrate. It is preferable that the low dielectric constant green sheets 2a, 2b, 2c and 2d be formed in a relatively high thickness and arranged as outermost layers. The multilayer green sheet obtained by suitably stacking the high dielectric constant green sheets and the low dielectric constant green sheets is pressure bonded by a press; and a process of peeling off a carrier film is repeated by the number of times corresponding to the number of ceramic substrate layers, and thereby producing an unsintered multilayer ceramic laminate (which is simply referred to as "unsintered multilayer dielectric substrate" hereinafter).

An example of the above-mentioned process will be described. A low dielectric constant green sheet 2a with a carrier film as a first layer to be positioned on the top surface side of an unsintered multilayer dielectric substrate is turned over so that the carrier film side becomes upward, is set on a fixing film, and is pressure bonded using a metal mold by a press at a predetermined pressure, temperature and time. For example, the conditions are a pressure of 1 to 5 MPa (10 to 51 kgf/cm$^2$), a temperature of 30 to 60° C. and a time of 3 to 15 sec. The upper and lower metal molds for thermal pressure bonding may be a simple flat plate form having a built-in heater. After the pressure bonding by the pressing is completed, the carrier film is peeled off the low dielectric constant green sheet 2a. In this case, the low dielectric constant green sheet 2a is fixed on the fixing film, and is never peeled together when the carrier film is peeled. If the via holes in the carrier film are made small so that continuous through via holes are not formed in the carrier film by properly selecting a laser wavelength to form via holes, a conductor paste filled in the via holes of the low dielectric constant green sheet 2a becomes hardly pulled out together when the carrier film is peeled, and thus the occurrence of conduction failure due to no connection of via wiring can be prevented consequently.

Then, a high dielectric constant green sheet 3a as a second layer is laminated. On the high dielectric constant green sheet 3a, conductor patterns constituting internal circuit wiring are printed. The ceramic green sheet 3a is set so that the principal surface of the ceramic green sheet 3a contacts with the low dielectric constant green sheet 2a of the first layer, and the laminate is pressed and pressure bonded as in the case of the low dielectric constant green sheet of the first layer. Thereafter, if the press temperature is a temperature at which an adhesive in a printing paste is softened and fixed, the printing portion bonds with the green sheet 2a of the mating side by the applied pressure. Therefore, the green sheets are connected through the printing conductor paste. Also, portions where there is no electrode and the green sheets contact directly with each other are softened, fixed, and bonded as in the case of the contact of the green sheets through the electrodes. In this case, the pressure bonding temperature, depending on the type of the adhesive, may be usually a low temperature of about 40 to 90° C., and the bonding strength can be regulated by varying the applied pressure. After the pressure bonding, the carrier film of the high dielectric constant green sheet 3a is peeled. From a high dielectric constant green sheet 3b as a third layer to a low dielectric constant green sheet corresponding to the top surface layer on the rear (bottom) side, the lamination is carried out using a process similar to the process for the high dielectric constant green sheet as the second layer. In order to strongly integrate the laminate, after the entire is laminated, the pressure bonding process may be further carried out.

Additionally, regarding a series of processes of pressure bonding, peeling and lamination, a part of or all of them may be carried out under a reduced pressure atmosphere. If done so, bubbles between green sheets are easily removed; the dimensional precision in lamination can be held; and the delamination can be reduced.

In the present embodiment, on the bottom surface (the opposite surface opposing to the ceramic substrate layer surface of the top surface) of an unsintered multilayer dielectric substrate which is thus obtained, surface electrodes on the bottom side are formed by printing according to a target circuit by using a conductor paste containing Ag as a main component.

Additionally, an overcoat material may suitably be formed on the circumferences of conductor patterns on the substrate surface and the bottom surface. The material of the overcoat material is desirably close to the material of the unsintered multilayer dielectric substrate in the sintering shrinkage property and the thermal expansion property. For example, the overcoat material includes one in which an additional component to give a function of improving the visibility of the coat portion is added to a slurry of the same material as the ceramic green sheet. By coating the peripheries of the surface conductor patterns with an overcoat to form coated regions of the electrodes, the surface conductor patterns can be mechanically protected; and the short circuit, for example, the short circuit due to the facts that in the subsequent process a solder provided on a conductor pattern flows out and contacts with a conductive portion, can be prevented. A conductor pattern on the substrate surface and an overcoat material are not necessarily provided in the state of an unsintered multilayer dielectric substrate, and they may be formed on a multilayer ceramic substrate after sintering.

In the present embodiment, the unsintered multilayer dielectric substrate which is thus obtained is thermally pressure bonded by a CIP apparatus at 10 to 40 MPa (100 to 400 kgf/cm$^2$) and 85° C. to make an unsintered multilayer dielectric substrate integrating each layer.

Then, grooves are formed by making a cut in a surface of the unsintered multilayer dielectric substrate using a jig such as a knife cutter, and thereby forming dividing grooves. The shapes of dividing grooves differ depending on the size of assembled substrates and the size of product substrates. The dividing groove is formed with a sufficient size margin so as not to exert an adverse effect such as injuring conductor patterns constituting a circuit, and is formed with a distance of about 100 to 250 μm apart from the end of the conductors in plan view. This dividing groove is, for example, a V-shaped groove, and the depth is, for example, in the case where the dividing grooves are cut on both the upper and lower surfaces, made so that the total of depths of grooves on both the surfaces is 30% or less of the thickness of an unsintered multilayer dielectric substrate. The depth is, depending on the thickness of an unsintered multilayer dielectric substrate, generally about 0.01 to 0.2 mm. This is because if this depth is too deep, die releasing of the cutter deteriorates and the deformation easily occurs, and thereby causing starting points of cracks in the sintering process. The dividing groove does not necessarily need to be formed on both the surfaces, and may be on either one of the upper surface and the bottom surface. The dividing method to be used may include a method of forming no groove and carrying out a dicing or scribing process after the subsequent firing process in addition to a method of breaking along V-shaped grooves.

Then, the unsintered multilayer dielectric substrate is integrally fired in a firing furnace at a sintering temperature of 800 to 1,000° C. Thereafter, an etching treatment and a metal plating film formation treatment such as an electroless plating and the like are carried out on the via electrodes of the surface layer according to needs.

[Electronic Components]

When such a multilayer dielectric substrate is used, an electronic component is constituted by mounting a surface-mounting component on the surface of a metal plating layer 3 using a solder ball. The electronic component can be used for electronic devices such as cell phones. An electronic component to be mounted includes passive elements such as capacitors, inductors and resistors, and additionally semiconductor products, and further active elements such as module components including arrays in which a plurality of passive components is integrated. Such electronic components are, for example, dielectric resonators, filters, laminated capacitors, antenna switch modules and front end modules.

Hereinafter, a method for making the dielectric ceramic composition of the present invention will be described. With respect to a low temperature sintering component, a mixture obtained by weighing and mixing raw materials so as to become a target composition is dried, and the obtained powder is calcined. In the calcination process, by properly setting the calcination temperature, the reaction of the raw materials is made progress, and a part thereof is allowed to be vitrified. The powder which is thus calcined is pulverized by a method such as a ball milling to obtain a low temperature sintering component powder. With respect to an inorganic filler component, a mixture obtained by weighing and mixing raw materials so as to become a target composition is dried, and the obtained powder is calcined to obtain a calcined powder containing an ATiO$_3$ (A is an element consisting of at least one of Ca and Sr) phase. The powder is pulverized to obtain an inorganic filler powder. A powder obtained by mixing the low temperature sintering powder and the inorganic filler powder which are thus obtained in a suitable ratio is granulated, molded and fired, and thereby obtaining a desired sintered body. The inorganic filler component does not need to be necessarily calcined. In short, a sintered body may be obtained by mixing an inorganic filler component which is not subjected to calcination and the low temperature sintering component powder, granulating and molding the mixture, and firing the molding. If a desired crystal (ATiO$_3$ (A is an element consisting of at least one of Ca and Sr) phase) deposits and desired properties can be obtained, a method of obtaining the sintered body may not be a method of mixing an inorganic filler and the like which are subjected to the calcination as described above, but a method of calcining and pulverizing a mixture of raw materials of a low temperature sintering component and raw materials of an inorganic filler component. The case where such a method can be used is more preferable because the process is simplified.

In the present invention, the density of a sintered body was determined by measuring the size of a sample by a micrometer, measuring the weight by an electronic balance, and calculating the density from these values. The sintering shrinkage ratio was calculated by measuring the respective sizes of samples before and after sintering by a micrometer. The dielectric properties were determined by a method (according to JIS R1627) using a cylinder resonator by using a Network Analyzer (8720D, manufactured by Hewlett-Packard Development Co.). The dielectric constant was determined using a sample at 25° C. The thermal expansion coefficient was measured by a method according to JIS R1618. The XDR (X-ray Diffraction) analysis was carried out for a sintered body not be powdered, and was measured in the state of a sintered body, using a Cu-Kα tube under the conditions of a voltage of 40 kV and a current of 100 mA.

EXAMPLES

As a low temperature sintering component, raw materials were weighed and mixed so as to have a composition shown in Table 1; the mixed powder was calcined at 750° C.; and the calcined powder was pulverized into a particle diameter of 1 μm or less to make a powder of the low temperature sintering component. As raw materials of SrO, Na$_2$O and K$_2$O, SrCO$_3$, Na$_2$CO$_3$ and K$_2$CO$_3$ were used, respectively. As an inorganic filler component, raw materials were weighed and mixed so as to become a composition shown in Table 2, thereafter calcined at 1,100° C., and pulverized into a particle diameter of 1 μm or less to obtain a powder of an inorganic filler component. In Table 2, CTO indicates a CaTiO$_3$ phase; STO indicates a SrTiO$_3$ phase; NTO indicates a Nd$_{2/3}$TiO$_3$ phase; LTO indicates a La$_{2/3}$TiO$_3$ phase; SmTO indicates a Sm$_{2/3}$TiO$_3$ phase; and MZTO indicates a (Mg.Zn)$_2$TiO$_4$ phase. Thereafter, the low temperature sintering component and the inorganic filler component were weighed and mixed so as to have respective ratios in Table 3. Specific components were as shown in Table 4. The powder thus obtained was granulated using an acrylic binder solution, thereafter molded into a cylindrical shape of 14 mm in diameter and 7.8 mm in height, fired at 900° C., and thereafter worked into 5.8 mm in height. The dielectric properties were evaluated using the obtained sample by a dielectric resonator method (JIS R1627). The thermal expansion coefficient was acquired by fabricating a sample of a cylindrical shape of 3 mm in diameter and 8 mm in height, and measuring the thermal expansion coefficient (40 to 600° C.) using TMA8140, made by Rigaku Corp. The evaluation of the sinterability was carried out as follows: a cylindrical molded sample obtained by a similar fabrication method was held at 850° C. to 950° C. for 2 hours; and if a fired dielectric ceramic composition exhibited a saturated density at 900° C. or lower, the dielectric ceramic composition was denoted as ○; if exhibited unsaturation, the dielectric ceramic composition was denoted as X. These results are shown in Table 3.

TABLE 1

| Sample No. | Low Temperature Sintering Component (oxide wt %) | | | | | | | | | |
|---|---|---|---|---|---|---|---|---|---|---|
| | SrO | Al$_2$O$_3$ | SiO$_2$ | Na$_2$O | K$_2$O | CuO | Mn$_3$O$_4$ | Bi$_2$O$_3$ | B$_2$O$_3$ | Ag |
| G1* | 17 | 17 | 52 | 3.1 | 0.8 | 0.5 | 0.8 | 3.9 | 1.6 | 2.0 |
| G2 | 22 | 22 | 44 | 3.1 | 0.8 | 0.5 | 0.8 | 3.9 | 1.6 | 2.0 |
| G3* | 26 | 26 | 35 | 3.1 | 0.8 | 0.5 | 0.8 | 3.9 | 1.6 | 2.0 |
| G4* | 17 | 8 | 61 | 3.4 | 0.8 | 0.5 | 0.8 | 4.2 | 1.7 | 2.2 |
| G5* | 13 | 27 | 49 | 2.7 | 0.7 | 0.4 | 0.7 | 3.4 | 1.3 | 1.8 |
| G6 | 13 | 27 | 48 | 2.7 | 0.7 | 0.4 | 0.7 | 3.3 | 2.7 | 1.7 |
| G7 | 18 | 35 | 35 | 2.7 | 0.7 | 0.4 | 0.7 | 3.3 | 2.7 | 1.7 |
| G8 | 15 | 29 | 44 | 2.7 | 0.7 | 0.4 | 0.7 | 3.3 | 2.7 | 1.7 |
| G9* | 13 | 32 | 46 | 2.5 | 0.6 | 0.4 | 0.6 | 3.2 | 1.3 | 1.6 |
| G10* | 12 | 36 | 43 | 2.4 | 0.6 | 0.4 | 0.6 | 3.0 | 1.2 | 1.5 |
| G11* | 3 | 30 | 58 | 2.4 | 0.6 | 0.4 | 0.6 | 3.0 | 1.2 | 1.5 |

TABLE 2

| Sample No. | Inorganic Filler (oxide wt %) | | | | | | | | Emerging Phase |
|---|---|---|---|---|---|---|---|---|---|
| | CaO | SrO | Nd$_2$O$_3$ | La$_2$O$_3$ | Sm$_2$O$_3$ | MgO | ZnO | TiO$_2$ | |
| F1 | 41 | — | — | — | — | — | — | 59 | CTO |
| F2 | 33 | — | 12 | — | — | — | — | 55 | CTO + NTO |
| F3 | 17 | — | 34 | — | — | — | — | 49 | CTO + NTO |
| F4 | 14 | — | 33 | 16 | — | — | — | 37 | CTO + NTO + LTO |
| F5 | 11 | — | 27 | 13 | — | 7 | 4 | 37 | CTO + NTO + LTO + MZTO |
| F6 | 17 | — | 30 | — | — | 8 | 4 | 41 | CTO + NTO + MZTO |
| F7 | 26 | — | 9 | — | — | 10 | 5 | 49 | CTO + NTO + MZTO |
| F8 | — | 56 | — | — | — | — | — | 44 | STO |
| F9 | — | 40 | — | 27 | — | — | — | 32 | STO + LTO |
| F10 | — | 40 | 28 | — | — | — | — | 32 | STO + NTO |
| F11 | — | 52 | 15 | — | — | — | — | 33 | STO + NTO |
| F12 | — | 42 | — | — | — | 13 | 7 | 39 | STO + MZTQ |
| F13 | — | 28 | 26 | — | — | 7 | 4 | 35 | STO + NTO + MZTO |
| F14 | — | 40 | 7 | — | — | 8 | 4 | 40 | STO + NTO + MZTO |
| F15 | — | 29 | 29 | — | — | 4 | 2 | 35 | STO + NTO + MZTO |
| F16 | — | 19 | 25 | 12 | — | 7 | 4 | 34 | STO + NTO + LTO + MZTO |
| F19 | 28 | — | 19 | — | — | — | — | 53 | CTO + NTO |
| F20 | 21 | — | 27 | — | — | — | — | 49 | CTO + NTO |
| F21 | 33 | — | — | — | 12 | — | — | 55 | CTO + SmTO |
| F22 | — | 40 | — | — | 7 | 8 | 4 | 40 | STO + SmTO + MZTO |

(Properties of the Low Temperature Sintering Component + the Inorganic Filler Component)

TABLE 3

| Sample No. | Inorganic Filler | Low Temperature Sintering Component | Filler Amount (wt %) | Dielectric Constant | fQ (GHz) | τf (ppm/° C.) | Thermal Expansion Coefficient (ppm/° C.) | Sinterability | Existence or Non-Existence of Crack and Delamination between Different Material Layers |
|---|---|---|---|---|---|---|---|---|---|
| 1* | F5 | G1 | 40 | 14 | 3000 | 10 | 8.0 | ○ | existence |
| 2 | F5 | G2 | 40 | 15 | 3000 | 20 | 6.3 | ○ | non-existence |
| 3* | F5 | G3 | 40 | 14 | 3000 | 20 | 6.4 | x | existence |
| 4* | F5 | G4 | 40 | — | — | — | — | ○ | non-existence |
| 5* | F5 | G5 | 40 | 11 | 4000 | 0 | 6.0 | x | existence |
| 6 | F5 | G6 | 40 | 12 | 3000 | 0 | 6.2 | ○ | non-existence |
| 7 | F5 | G7 | 40 | 12 | 3000 | 0 | 6.2 | ○ | non-existence |
| 8 | F5 | G8 | 40 | 12 | 3000 | 0 | 6.1 | ○ | non-existence |
| 9* | F5 | G9 | 40 | 12 | 2000 | 0 | 6.2 | x | existence |
| 10* | F5 | G10 | 40 | 11 | 2000 | 0 | 6.2 | x | existence |

TABLE 3-continued

| Sample No. | Inorganic Filler | Low Temperature Sintering Component | Filler Amount (wt %) | Dielectric Constant | fQ (GHz) | τf (ppm/° C.) | Thermal Expansion Coefficient (ppm/° C.) | Sinterability | Existence or Non-Existence of Crack and Delamination between Different Material Layers |
|---|---|---|---|---|---|---|---|---|---|
| 11* | F5 | G11 | 40 | 13 | 2000 | 20 | 8.2 | ○ | existence |
| 12* | F1 | G6 | 40 | 21 | 2000 | 150 | 7.2 | ○ | non-existence |
| 13 | F1 | G6 | 30 | 14 | 2000 | 90 | 6.6 | ○ | non-existence |
| 14 | F2 | G6 | 40 | 19 | 2000 | 100 | 6.3 | ○ | non-existence |
| 15 | F3 | G6 | 40 | 15 | 3000 | 50 | 5.8 | ○ | non-existence |
| 16 | F4 | G6 | 40 | 16 | 3000 | 70 | 6.6 | ○ | non-existence |
| 17 | F6 | G6 | 40 | 12 | 4000 | 0 | 6.8 | ○ | non-existence |
| 18 | F7 | G6 | 40 | 14 | 3000 | 50 | 6.8 | ○ | non-existence |
| 19 | F8 | G6 | 40 | 22 | 2000 | 280 | 6.1 | ○ | non-existence |
| 20 | F9 | G6 | 40 | 12 | 3000 | 80 | 6.3 | ○ | non-existence |
| 21 | F10 | G6 | 40 | 13 | 3000 | 60 | 5.9 | ○ | non-existence |
| 22 | F11 | G6 | 40 | 15 | 3000 | 90 | 5.8 | ○ | non-existence |
| 23 | F12 | G6 | 40 | 14 | 4000 | 80 | 6.5 | ○ | non-existence |
| 24 | F13 | G6 | 40 | 13 | 3000 | 70 | 6.1 | ○ | non-existence |
| 25 | F14 | G6 | 40 | 15 | 2000 | 100 | 6.2 | ○ | non-existence |
| 26 | F15 | G6 | 40 | 15 | 3000 | 90 | 6.0 | ○ | non-existence |
| 27 | F16 | G6 | 40 | 13 | 3000 | 20 | 6.3 | ○ | non-existence |
| 30 | F19 | G6 | 40 | 18.0 | 2000.0 | 95.0 | 6.2 | ○ | non-existence |
| 31 | F20 | G6 | 40 | 16.0 | 3000.0 | 65.0 | 6.1 | ○ | non-existence |
| 32 | F21 | G6 | 40 | 17.0 | 2000.0 | 80.0 | 6.2 | ○ | non-existence |
| 33 | F22 | G6 | 40 | 12.0 | 4000.0 | 70.0 | 6.8 | ○ | non-existence |

(Entire Composition of the Low Temperature Sintering Component+the Inorganic Filler Component)

TABLE 4

| Sample No. | CaO | SrO | $Nd_2O_3$ | $La_2O_3$ | $Sm_2O_3$ | MgO | ZnO | $TiO_2$ | SrO | $Al_2O_3$ | $SiO_2$ | $Na_2O$ | $K_2O$ | CuO | $Mn_3O_4$ | $Bi_2O_3$ | $B_2O_3$ | Ag |
|---|---|---|---|---|---|---|---|---|---|---|---|---|---|---|---|---|---|---|
| 1* | 4.5 | 0.0 | 10.8 | 5.3 | 0.0 | 2.9 | 1.6 | 14.8 | 10.5 | 10.5 | 31.5 | 1.9 | 0.5 | 0.3 | 0.5 | 2.3 | 0.9 | 1.2 |
| 2 | 4.5 | 0.0 | 10.8 | 5.3 | 0.0 | 2.9 | 1.6 | 14.8 | 13.1 | 13.1 | 26.2 | 1.9 | 0.5 | 0.3 | 0.5 | 2.3 | 0.9 | 1.2 |
| 3* | 4.5 | 0.0 | 10.8 | 5.3 | 0.0 | 2.9 | 1.6 | 14.8 | 15.7 | 15.7 | 21.0 | 1.9 | 0.5 | 0.3 | 0.5 | 2.3 | 0.9 | 1.2 |
| 4* | 4.5 | 0.0 | 10.8 | 5.3 | 0.0 | 2.9 | 1.6 | 14.8 | 10.2 | 5.1 | 36.5 | 2.0 | 0.5 | 0.3 | 0.5 | 2.5 | 1.0 | 1.3 |
| 5* | 4.5 | 0.0 | 10.8 | 5.3 | 0.0 | 2.9 | 1.6 | 14.8 | 8.1 | 16.2 | 29.1 | 1.6 | 0.4 | 0.2 | 0.4 | 2.0 | 0.8 | 1.1 |
| 6 | 4.5 | 0.0 | 10.8 | 5.3 | 0.0 | 2.9 | 1.6 | 14.8 | 8.0 | 16.0 | 28.8 | 1.6 | 0.4 | 0.2 | 0.4 | 2.0 | 1.6 | 1.0 |
| 7 | 4.5 | 0.0 | 10.8 | 5.3 | 0.0 | 2.9 | 1.6 | 14.8 | 10.5 | 21.1 | 21.1 | 1.6 | 0.4 | 0.2 | 0.4 | 2.0 | 1.6 | 1.0 |
| 8 | 4.5 | 0.0 | 10.8 | 5.3 | 0.0 | 2.9 | 1.6 | 14.8 | 8.8 | 17.6 | 26.4 | 1.6 | 0.4 | 0.2 | 0.4 | 2.0 | 1.6 | 1.0 |
| 9* | 4.5 | 0.0 | 10.8 | 5.3 | 0.0 | 2.9 | 1.6 | 14.8 | 7.6 | 19.0 | 27.3 | 1.5 | 0.4 | 0.2 | 0.4 | 1.9 | 0.8 | 1.0 |
| 10* | 4.5 | 0.0 | 10.8 | 5.3 | 0.0 | 2.9 | 1.6 | 14.8 | 7.1 | 21.4 | 25.7 | 1.4 | 0.4 | 0.2 | 0.4 | 1.8 | 0.7 | 0.9 |
| 11* | 4.5 | 0.0 | 10.8 | 5.3 | 0.0 | 2.9 | 1.6 | 14.8 | 1.6 | 17.9 | 34.7 | 1.4 | 0.4 | 0.2 | 0.4 | 1.8 | 0.7 | 0.9 |
| 12* | 16.4 | 0.0 | 0.0 | 0.0 | 0.0 | 0.0 | 0.0 | 23.6 | 8.0 | 16.0 | 28.8 | 1.6 | 0.4 | 0.2 | 0.4 | 2.0 | 1.6 | 1.0 |
| 13 | 12.3 | 0.0 | 0.0 | 0.0 | 0.0 | 0.0 | 0.0 | 17.7 | 9.3 | 18.6 | 33.6 | 1.9 | 0.5 | 0.3 | 0.5 | 2.3 | 1.9 | 1.2 |
| 14 | 13.2 | 0.0 | 4.7 | 0.0 | 0.0 | 0.0 | 0.0 | 22.1 | 8.0 | 16.0 | 28.8 | 1.6 | 0.4 | 0.2 | 0.4 | 2.0 | 1.6 | 1.0 |
| 15 | 6.8 | 0.0 | 13.7 | 0.0 | 0.0 | 0.0 | 0.0 | 19.5 | 8.0 | 16.0 | 28.8 | 1.6 | 0.4 | 0.2 | 0.4 | 2.0 | 1.6 | 1.0 |
| 16 | 5.5 | 0.0 | 13.2 | 6.4 | 0.0 | 0.0 | 0.0 | 14.9 | 8.0 | 16.0 | 28.8 | 1.6 | 0.4 | 0.2 | 0.4 | 2.0 | 1.6 | 1.0 |
| 17 | 6.9 | 0.0 | 11.9 | 0.0 | 0.0 | 3.2 | 1.8 | 16.2 | 8.0 | 16.0 | 28.8 | 1.6 | 0.4 | 0.2 | 0.4 | 2.0 | 1.6 | 1.0 |
| 18 | 10.5 | 0.0 | 3.7 | 0.0 | 0.0 | 3.9 | 2.2 | 19.7 | 8.0 | 16.0 | 28.8 | 1.6 | 0.4 | 0.2 | 0.4 | 2.0 | 1.6 | 1.0 |
| 19 | 0.0 | 22.6 | 0.0 | 0.0 | 0.0 | 0.0 | 0.0 | 17.4 | 8.0 | 16.0 | 28.8 | 1.6 | 0.4 | 0.2 | 0.4 | 2.0 | 1.6 | 1.0 |
| 20 | 0.0 | 16.2 | 0.0 | 11.0 | 0.0 | 0.0 | 0.0 | 12.8 | 8.0 | 16.0 | 28.8 | 1.6 | 0.4 | 0.2 | 0.4 | 2.0 | 1.6 | 1.0 |
| 21 | 0.0 | 16.1 | 11.3 | 0.0 | 0.0 | 0.0 | 0.0 | 12.7 | 8.0 | 16.0 | 28.8 | 1.6 | 0.4 | 0.2 | 0.4 | 2.0 | 1.6 | 1.0 |
| 22 | 0.0 | 20.7 | 6.0 | 0.0 | 0.0 | 0.0 | 0.0 | 13.3 | 8.0 | 16.0 | 28.8 | 1.6 | 0.4 | 0.2 | 0.4 | 2.0 | 1.6 | 1.0 |
| 23 | 0.0 | 16.6 | 0.0 | 0.0 | 0.0 | 5.1 | 2.8 | 15.5 | 8.0 | 16.0 | 28.8 | 1.6 | 0.4 | 0.2 | 0.4 | 2.0 | 1.6 | 1.0 |
| 24 | 0.0 | 11.2 | 10.4 | 0.0 | 0.0 | 2.8 | 1.6 | 14.1 | 8.0 | 16.0 | 28.8 | 1.6 | 0.4 | 0.2 | 0.4 | 2.0 | 1.6 | 1.0 |
| 25 | 0.0 | 15.9 | 2.9 | 0.0 | 0.0 | 3.2 | 1.8 | 16.1 | 8.0 | 16.0 | 28.8 | 1.6 | 0.4 | 0.2 | 0.4 | 2.0 | 1.6 | 1.0 |
| 26 | 0.0 | 11.8 | 11.7 | 0.0 | 0.0 | 1.6 | 0.9 | 14.0 | 8.0 | 16.0 | 28.8 | 1.6 | 0.4 | 0.2 | 0.4 | 2.0 | 1.6 | 1.0 |
| 27 | 0.0 | 7.6 | 9.9 | 4.8 | 0.0 | 2.7 | 1.5 | 13.5 | 8.0 | 16.0 | 28.8 | 1.6 | 0.4 | 0.2 | 0.4 | 2.0 | 1.6 | 1.0 |
| 28 | 5.6 | 0.0 | 13.6 | 0.0 | 0.0 | 0.0 | 0.8 | 20.0 | 8.0 | 16.0 | 28.8 | 1.6 | 0.4 | 0.2 | 0.4 | 2.0 | 1.6 | 1.0 |
| 29 | 0.0 | 0.0 | 19.6 | 0.0 | 0.0 | 0.0 | 1.7 | 18.6 | 8.0 | 16.0 | 28.8 | 1.6 | 0.4 | 0.2 | 0.4 | 2.0 | 1.6 | 1.0 |
| 30 | 10.8 | 0.0 | 8.0 | 0.0 | 0.0 | 0.0 | 0.0 | 21.2 | 8.0 | 16.0 | 28.8 | 1.6 | 0.4 | 0.2 | 0.4 | 2.0 | 1.6 | 1.0 |
| 31 | 8.8 | 0.0 | 10.0 | 0.0 | 0.0 | 0.0 | 0.0 | 21.2 | 8.0 | 16.0 | 28.8 | 1.6 | 0.4 | 0.2 | 0.4 | 2.0 | 1.6 | 1.0 |
| 32 | 13.2 | 0.0 | 0.0 | 0.0 | 4.7 | 0.0 | 0.0 | 22.1 | 8.0 | 16.0 | 28.8 | 1.6 | 0.4 | 0.2 | 0.4 | 2.0 | 1.6 | 1.0 |
| 33 | 0.0 | 15.9 | 0.0 | 0.0 | 2.9 | 3.2 | 1.8 | 16.1 | 8.0 | 16.0 | 28.8 | 1.6 | 0.4 | 0.2 | 0.4 | 2.0 | 1.6 | 1.0 |

In Tables 3 and 4, the samples with an asterisk indicate that they fall outside the range of the dielectric ceramic composition according to the present invention. By using the inorganic filler components of F1 to F22 containing an $ATiO_3$ phase and low temperature sintering components of G2, and G6 to G8 containing glass components capable of crystallizing a $SrAl_2Si_2O_8$ phase as a crystal phase after the firing, it is possible to fire them at a temperature of 1,000° C. or lower, and the dielectric ceramic compositions can be achieved which have the dielectric constant of 10 or higher in the frequency range of 1 GHz to 5 GHz and a thermal expansion coefficient of lower than 7 ppm/° C. in the temperature range of 40 to 600° C. (No. 2, Nos. 6 to 8, and Nos. 13 to 33). Specifically, in these samples, the densities of the sintered bodies are saturated at a temperature of at least 900° C., and thus it becomes possible to achieve high densification at such a temperature. By contrast, in the samples of No. 1 and No. 11 using G1 and G11, respectively, the thermal expansion coefficients became the large value of 7 ppm/° C. or higher by reaction with the fillers. In the sample of No. 4 using G4, which produced no $A(Sr)Al_2Si_2O_8$ phase, the dielectric properties could not be measured. The suitable combinations of the inorganic filler components and the low temperature sintering components allowed the thermal expansion coefficients to be controlled to 6 ppm/° C. or lower (No. 15, No. 21 and No. 22). It was further found that the samples containing $RTiO_3$ (R is at least one of Nd, La and Sm) by making Nd, La and/or Sm contained therein, and the samples containing $M_2TiO_4$ (M is at least one of Mg and Zn) by making Mg and/or Zn contained therein had smaller absolute values of the temperature coefficient $\tau_f$ of the resonance frequency than the samples not containing these elements (No. 12 and No. 19). By controlling these additives and the like, the dielectric ceramic compositions having absolute values of the temperature coefficients $\tau_f$ of the resonance frequency of 120 ppm/° C. or lower can be achieved.

Each phase ($CaTiO_3$, $SrTiO_3$, $Nd_{2/3}TiO_3$, $La_{2/3}TiO_3$, $Sm_{2/3}TiO_3$, and $(Mg.Zn)_2TiO_4$) emerged in the inorganic filler components remains in the dielectric ceramic compositions.

Then, the blending amounts of a low temperature sintering component and an inorganic filler component were examined.

As a low temperature sintering component, G6 shown in Table 1 was used. As an inorganic filler, F2 shown in Table 2 was used.

Table 5 shows a relationship between the content of the blended inorganic filler component and the dielectric constant, and a relationship between the dielectric constant and the densification temperature. The dielectric constant increases as the blending amount of the inorganic filler component increases, and a dielectric ceramic composition having a high dielectric constant can be produced in 40% by weight or more of the inorganic filler component. By setting the blending amount of the low temperature sintering component to 80% by weight or less, the densification temperature decreases, and can be nearly the same temperature as a silver electrode firing temperature in LTCC. The blending ratio of the low temperature sintering component:the inorganic filler was preferably 45 to 75:25 to 55, and more preferably 50 to 70:30 to 50.

TABLE 5

| Sample No. | Amount of a Low Temperature Sintering Component (wt %) | Amount of an Inorganic Filler (wt %) | Dielectric Constant | Densification Temperature (° C.) |
|---|---|---|---|---|
| 1 | 40 | 60 | 11 | 863 |
| 2 | 45 | 55 | 12 | 874 |
| 3 | 50 | 50 | 14 | 887 |
| 4 | 55 | 45 | 16 | 901 |
| 5 | 60 | 40 | 18 | 921 |
| 6 | 65 | 35 | 21 | 949 |
| 7 | 70 | 30 | 24 | 996 |
| 8 | 75 | 25 | 27 | 1028 |
| 9 | 80 | 20 | 31 | 1090 |

Figure 3:
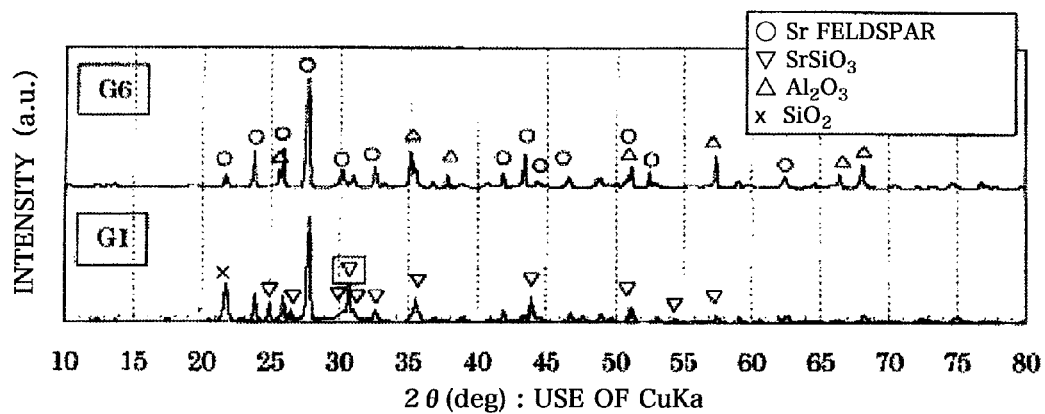
FIG. 3 is an XRD analysis result of a sintered body of a low temperature sintering component.

FIG. 3 shows results of measurements of the sintered body of the low temperature sintering component of the sample No. G1 in Table 1 by means of XRD (X-ray Diffraction). The sintering temperature is 750. The measurements of the XRD were carried out under the conditions of the use of a Cu-Kα tube, a current of 100 mA and a voltage of 40 kV.

The deposition of $SrSiO_3$ and $SiO_2$ was confirmed from the analysis of the peak angles that in addition to a Sr feldspar. As for this result, it is assumed that $Al_2O_3$ for forming a Sr feldspar ($SrAl_2Si_2O_8$) was insufficient and excessive SrO and $SiO_2$ occurred as the deposition of $SrSiO_3$ and $SiO_2$. The thermal expansion coefficient of $SrSiO_3$ is 10.3 ppm/° C. and deposition of the component causes an increase in the thermal expansion coefficient. $SiO_2$ is known to exhibit an abnormal volume change of about 1% due to the phase change nearly at 100° C. to 200° C., and it is assumed that $SiO_2$ contributes to an increase in the thermal expansion coefficient.

On the other hand, in the low temperature sintering component in the sample No. G6 in Table 1, these $SrSiO_3$ and $SiO_2$ are not observed. By increasing $Al_2O_3$ and promoting the deposition of a Sr feldspar in the low temperature sintering component, $SrSiO_3$ and $SiO_2$ can be suppressed.

The influence of the increase of the $Al_2O_3$ amount on a low temperature sintering component was confirmed using an admixture with the high dielectric constant filler.

Figure 4:
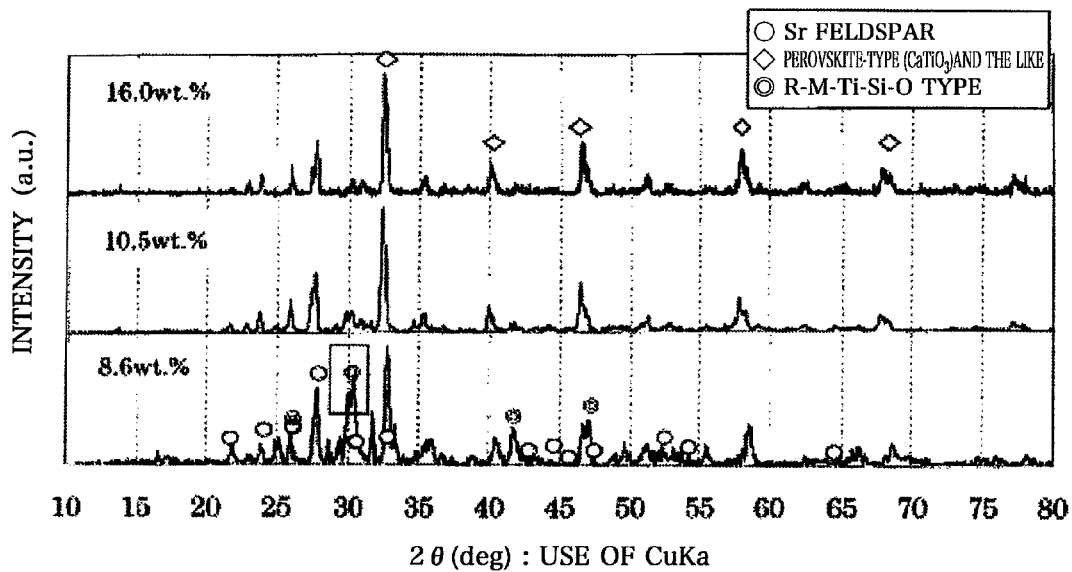
FIG. 4 is an XRD analysis result of a dielectric ceramic composition.

FIG. 4 shows XRD patterns of dielectric compositions obtained by mixing low temperature sintering components containing predetermined $Al_2O_3$ amounts with 40% by weight of the high dielectric constant filler. The main peak of a Sr feldspar is highest, which emerges at a position of 32.8°. The mark "□" in the figure is the main peak at 2θ=30.2° of R(Nd)-M(Mg)—Ti—Si—O, and since it is not detected in the case where the high dielectric constant filler and the low temperature sintering component are individually fired, it is assumed that this peak shows a novel reaction product produced by the reaction of the both.

Figure 5:
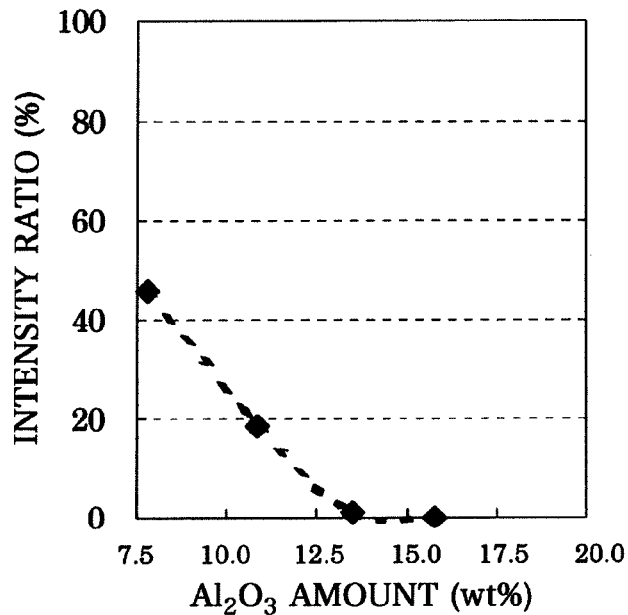
FIG. 5 is a diagram showing a relationship between the additive amount of $Al_2O_3$ and the intensity ratio of an RMTi-SiO type phase.

FIG. 5 shows a relationship between the intensity ratio of the main peak of R(Nd)-M(Mg)—Ti—Si—O to the main peak of a Sr feldspar and the $Al_2O_3$ amount. Since the main peak of R-M-Ti—Si—O partially overlaps the peak of the Sr feldspar, intensities where no fluctuation is observed are used as a basis. From this result, it can be confirmed that the peak intensity of R-M-Ti—Si—O decreases as the $Al_2O_3$ amount increases. Therefore, it is assumed that the increase of the $Al_2O_3$ amount in a low temperature sintering component has a further effect of the reduction of the reaction between the high dielectric constant filler and the low temperature sintering component.

Also, in the case of Zn element other than Mg, if the $Al_2O_3$ amount is small, an R-M-Ti—Si—O type phase emerges similarly. If the content of Nd, La, Sm or Zn exceeds the prescribed range required in the present invention, this phase is liable to emerge. The emerging position of the main peak is the same position, 2θ=32.8°, as described the above.

The relationship between the A element and the $Al_2O_3$ amount is similar to the above; and if the $Al_2O_3$ amount is small and the A element amount contained exceeds the prescribed range required in the present invention, an A-Ti—Si—O (A is an element consisting of at least one of Ca and Sr) type phase is liable to emerge. The emerging position of the main peak is 2θ=29.6°.

Figure 6:
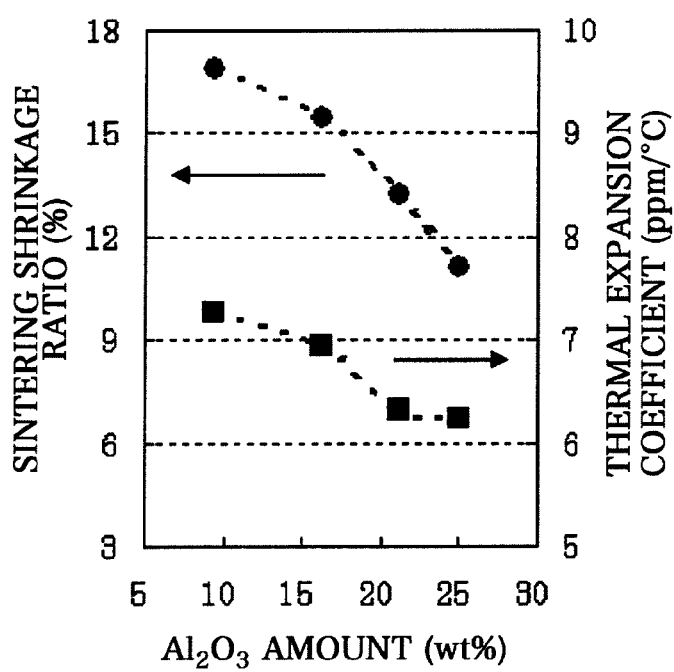
FIG. 6 is a diagram showing a relationship between the additive amount of $Al_2O_3$ and the sintering shrinkage percentage of a dielectric ceramic composition, and a relationship between the additive amount of $Al_2O_3$ and the thermal expansion coefficient of the dielectric ceramic composition.
Figure 7:
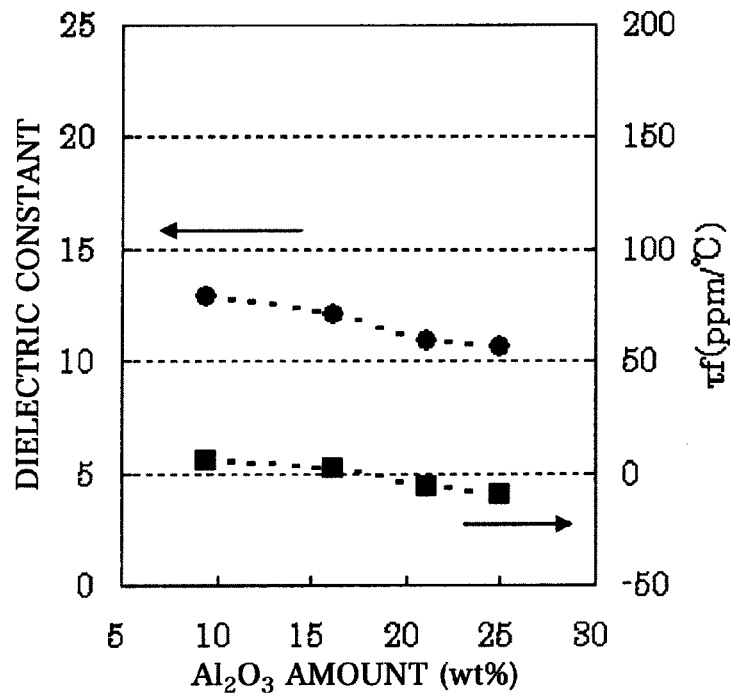
FIG. 7 is a diagram showing a relationship between the additive amount of $Al_2O_3$ and the dielectric constant of a dielectric ceramic composition, and a relationship between the additive amount of $Al_2O_3$ and the temperature coefficient t of the resonance frequency of the dielectric ceramic composition.

FIG. 6 shows, regarding the admixture fired at 900° C., relationships of the sintering shrinkage ratio and the thermal expansion coefficient with regard to the $Al_2O_3$ amount, FIG. 7 shows, regarding the admixture fired at 900° C., relationships of the dielectric constant and $\tau_f$ with regard to the $Al_2O_3$ amount.

The thermal expansion coefficient of the admixture decreases as the $Al_2O_3$ amount of a low temperature sintering component increases; and if the $Al_2O_3$ amount is 11.0% by weight or more, the thermal expansion coefficient can be made 7 ppm/° C. or lower.

Figure 8:
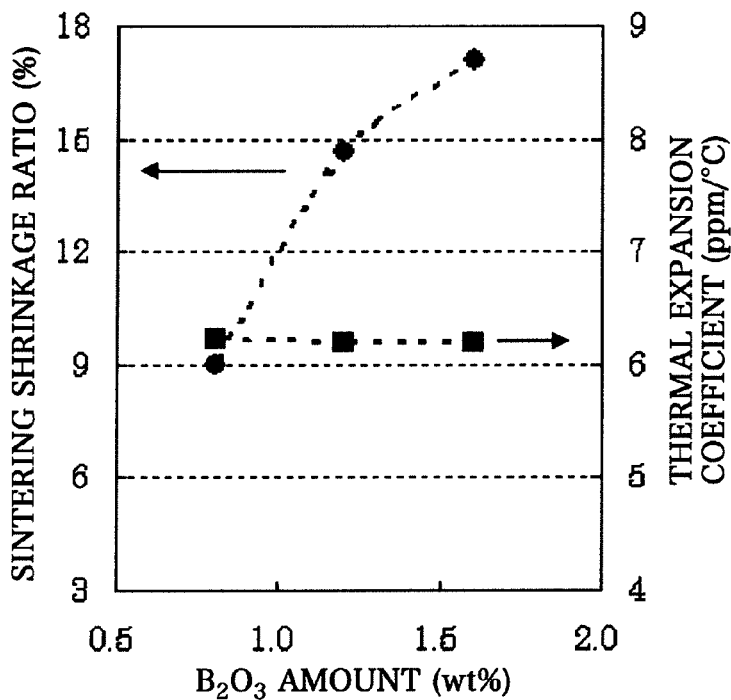
FIG. 8 is a diagram showing a relationship between the additive amount of $B_2O_3$ and the sintering shrinkage percentage of a dielectric ceramic composition, and a relationship between the additive amount of $Al_2O_3$ and the thermal expansion coefficient of the dielectric ceramic composition.

Making a high dielectric constant by increasing the amount of $B_2O_3$ used as a sintering aid was studied. FIG. 8 shows thermal properties of the admixture in which the $B_2O_3$ amount of a low temperature sintering component is varied. The sintering shrinkage ratio and the dielectric constant increases as the $B_2O_3$ amount increases. The values of $\tau_f$ and the thermal expansion coefficient do not change irrespective of the additive amount of $B_2O_3$. If the $B_2O_3$ amount exceeded 3% by weight, the formability deteriorates because a crosslinked structure is made. Thus, the $B_2O_3$ amount is preferably 3% by weight or less.

The ceramic layer(s) composed of a dielectric ceramic composition and the other dielectric layer(s) were made, laminated, and simultaneously fired in the laminated state. And, existence or non-existence of the crack and delamination between the both was confirmed.

First, the evaluations were carried out using the dielectric ceramic composition shown in Table 6 and the other dielectric layer(s) having the compositions shown therein.

The subsequent processes were carried out similarly to the above to produce a ceramic green sheet of the both.

15 parts by weight of a polyvinyl butyral resin as an organic binder, 7.5 parts by weight of bis(2-ethylhexyl) phthalate (DOP) as a plasticizer, and ethanol as a solvent were added to 100 parts by weight of the calcined material fine powder, and mixed in a ball mill to make a slurry. No dispersant was added.

The slurry was deaerated and a part of the ethanol was evaporated under the conditions of reduced pressure to regulate the slurry to a viscosity of about 7 Pa·s. The slurry was applied on a PET carrier film by a doctor blade method to form a sheet, and dried to obtain a green sheet for a substrate of 0.04 mm in thickness. The green sheet for a substrate was cut into 180 mm square with the carrier film.

The green sheet for a substrate was sufficiently dried. And thereafter, internal electrode patterns and external electrode patterns 4 were formed with a conductor paste containing Ag as a main component, and via electrodes 5 to connect the electrode patterns were suitably installed.

Figure 2:
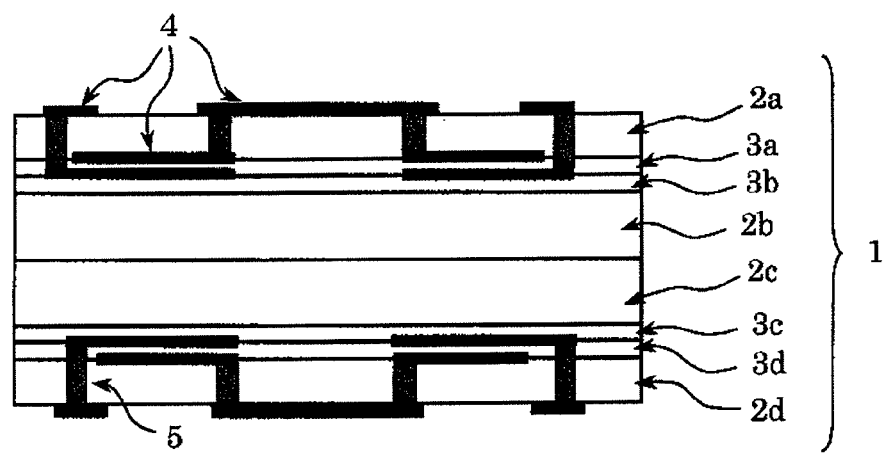
FIG. 2 is a cross-sectional diagram showing a structure of a multilayer dielectric substrate.

The green sheets 3a, 3b, 3c and 3d using the dielectric ceramic composition of the present invention and the green sheets 2a, 2b, 2c and 2d, each of which is the other dielectric layer were thus prepared, and they were arranged in the structure shown in FIG. 2. Every time one sheet was stacked, the stacked sheets were temporarily pressure bonded at a temperature of 60° C. and at a pressure of 30 kg/cm² (2.9 MPa); and after all the sheets were laminated, the laminated sheets were thermally pressure bonded at a temperature of 85° C. and at a pressure of 110 kg/cm² (10.8 MPa). In this way, the green sheets were laminated and pressure bonded together with the green sheets 2a, 2b, 2c and 2d, each of which is the layer of a dielectric ceramic composition having an $AAl_2Si_2O_8$ phase and an $Al_2O_3$ phase after the sintering, and thus an unsintered multilayer dielectric substrate was obtained as shown in FIG. 2.

Dividing grooves 5 having a cross-sectional shape of an isosceles triangle having a width of 0.15 mm and a depth of 0.1 mm were formed at intervals of 10 mm×15 mm by pressing a knife blade against the unsintered multilayer dielectric

TABLE 6

| Dielectric Ceramic Composition (Sample No. 14) (wt %) | CaO | SrO | $Al_2O_3$ | $SiO_2$ | $Na_2O$ | $K_2O$ | CuO | $Mn_3O_4$ |
|---|---|---|---|---|---|---|---|---|
| | 13.2 | 8.0 | 16.0 | 28.8 | 1.6 | 0.4 | 0.2 | 0.4 |
| | $Bi_2O_3$ | $B_2O_3$ | Ag | $Nd_2O_3$ | $La_2O_3$ | MgO | ZnO | $TiO_2$ |
| | 2.0 | 1.6 | 1.0 | 4.7 | 0.0 | 0.0 | 0.0 | (22.1) |
| The Other Dielectric Layer(s) (wt %) | CaO | SrO | $Al_2O_3$ | $SiO_2$ | $Na_2O$ | $K_2O$ | CuO | $Mn_3O_4$ |
| | 0 | 10.0 | 48.0 | 38.0 | 2.0 | 0.5 | 0.3 | 0.5 |
| | $Bi_2O_3$ | $B_2O3$ | Ag | $Nd_2O_3$ | $La_2O_3$ | MgO | ZnO | $TiO_2$ |
| | 2.5 | 0 | 0 | 0 | 0 | 0 | 0 | 4 |

A dielectric ceramic composition having the composition of the sample No. 14 shown in Tables 3 and 4 was charged in a polyethylene ball mill, wet pulverized for 17 hours, and thereafter dried to obtain a fine powder having an average particle diameter of 1 μm.

A calcined powder of the other dielectric layer(s) was obtained as follows. A material of the composition in Table 6 was charged in a polyethylene ball mill; and zirconium oxide media balls and pure water were further charged and wet mixed for 20 hours. After the slurry obtained thereby was dried by heating, the dried slurry was disintegrated by a Raikai mixer, put in an alumina crucible, and calcined at 800° C. for 2 hours. The obtained calcined material was charged in the ball mill and wet pulverized for 17 hours, and thereafter dried to obtain a fine powder having an average particle diameter of 1 μm.

substrate. The unsintered multilayer ceramic substrate obtained thereby was held in the air at 500° C. for 4 hours using a batch furnace to carry out a de-binder treatment, and thereafter, heated at a rate of 3° C./min up to 900° C. And, the temperature was then held for 2 hours, and spontaneously cooled in the furnace. Thereby, the multilayer dielectric substrate of the present invention was obtained.

The multilayer dielectric substrate which was thus obtained was polished, and observed to confirm the existence or non-existence of the crack and delamination. These results are shown in Table 3. All the compositions of Table 3 are shown in Table 4.

As for the other dielectric layer(s), the compositions shown in Table 7 also were tested. No occurrence of the crack and delamination between any one compositional layer and the high-dielectric layer(s) using the dielectric ceramic composition of the present invention and the other dielectric layer(s) of the compositions shown in the table was observed.

TABLE 7

Composition of the Other Dielectric Layer(s)

| Sample No. | TiO$_2$ | A'O | Al$_2$O$_3$ | Si$_O$2 | Na$_2$O | K$_2$O | CuO | Mn$_3$O$_4$ | Bi$_2$O$_3$ | Ag |
|---|---|---|---|---|---|---|---|---|---|---|
| 1 | 0.0 | 28.0 | 20.0 | 47.7 | 1.0 | 0.5 | 0.3 | 0.0 | 2.0 | 0.5 |
| 2 | 0.0 | 16.5 | 50.0 | 29.0 | 1.0 | 0.5 | 0.3 | 0.2 | 2.0 | 0.5 |
| 3 | 0.0 | 16.5 | 50.0 | 28.0 | 1.5 | 0.5 | 0.3 | 0.2 | 3.0 | 0.0 |
| 4 | 0.0 | 10.5 | 55.0 | 30.2 | 1.0 | 0.5 | 0.3 | 0.0 | 2.0 | 0.5 |
| 5 | 10.0 | 13.0 | 30.0 | 41.0 | 1.5 | 0.5 | 0.3 | 0.2 | 3.0 | 0.5 |
| 6 | 10.0 | 13.0 | 40.0 | 32.7 | 1.0 | 0.5 | 0.3 | 0.0 | 2.0 | 0.5 |
| 7 | 4.0 | 10.0 | 46.0 | 34.5 | 2.0 | 0.5 | 0.3 | 0.2 | 2.5 | 0.0 |
| 8 | 4.0 | 10.0 | 48.0 | 31.8 | 2.0 | 0.5 | 0.3 | 0.4 | 2.5 | 0.5 |
| 9 | 10.0 | (Ca) 13.0 | 30.0 | 41.0 | 1.5 | 0.5 | 0.3 | 0.2 | 3.0 | 0.5 |
| 9 | 10.0 | (Ba) 13.0 | 30.0 | 41.0 | 1.5 | 0.5 | 0.3 | 0.2 | 3.0 | 0.5 |

Figure 9:
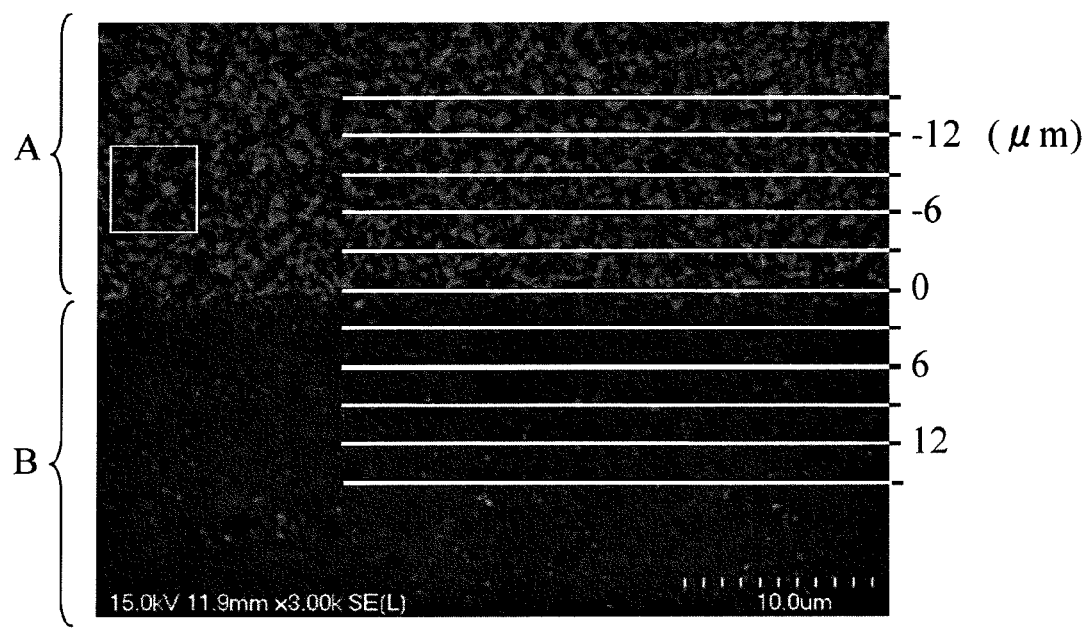
FIG. 9 is a photograph observing an interface between a high dielectric constant layer (a sintered body of a dielectric ceramic composition) and the other dielectric layer of a multilayer dielectric substrate after sintering.

FIG. 9 is a cross-sectional photograph of the multilayer dielectric substrate of the present invention; the region A of the upper part of the photograph is the layer composed of the dielectric ceramic composition of the present invention, and the region B is the other dielectric layer.

The dielectric ceramic composition of the present invention was prepared by mixing each raw material so as to make the composition shown in Table 6. The composition of the raw materials used for the other dielectric layer was shown together.

Figure 10:
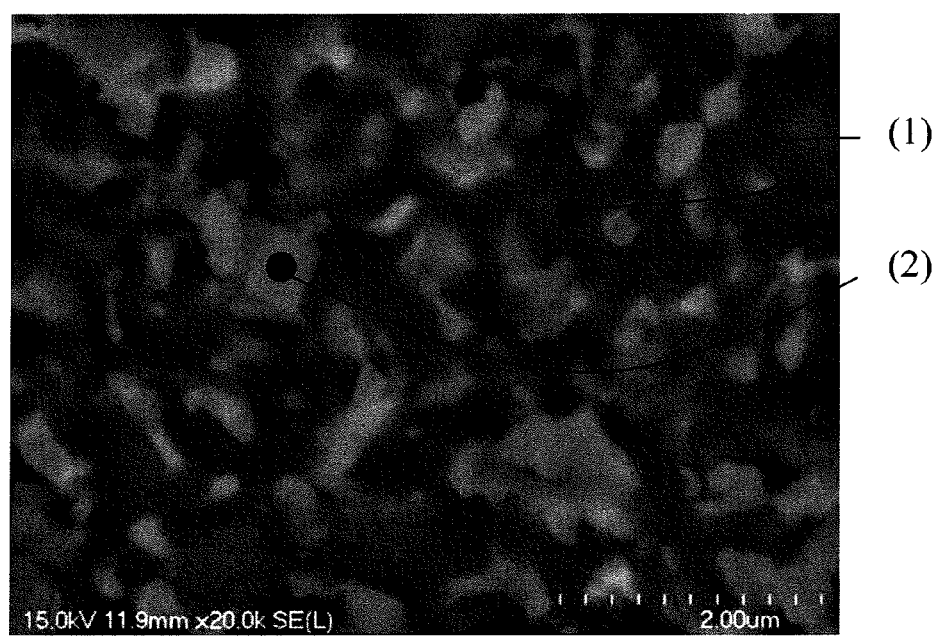
FIG. 10 is a photograph observing the high dielectric layer.

FIG. 10 is an enlarged diagram of a part surrounded by a square of the region A of FIG. 9. The part (1) shows a composition nearly equal to an inorganic filler component; and the part (2) shows a composition nearly equal to a low temperature sintering component.

Figure 11:
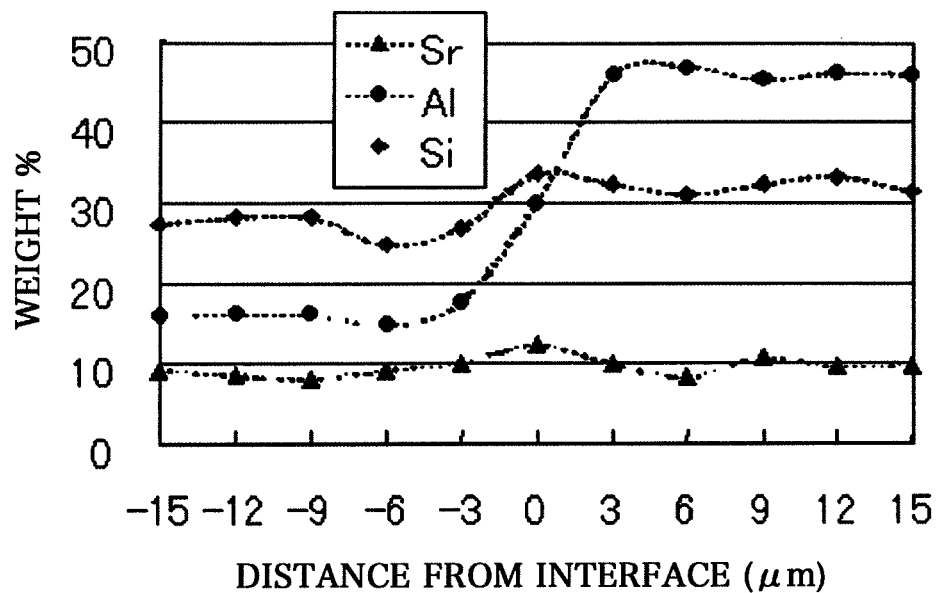
FIG. 11 is line analysis results at an interface between the high dielectric layer and the other dielectric layer.
Figure 12:
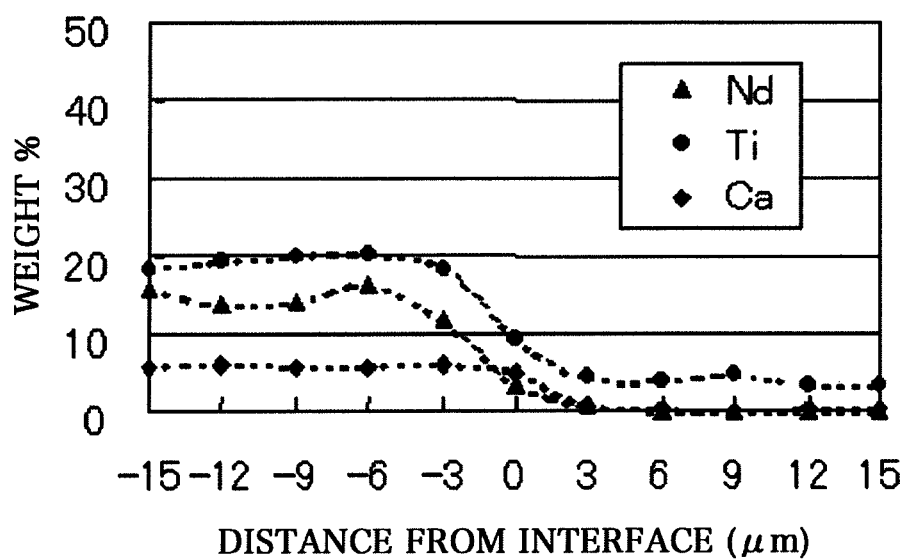
FIG. 12 is line analysis results at an interface between the high dielectric layer and the other dielectric layer.

FIG. 11 is line analysis results of the amount of each element of Sr, Al and Si, acquired by the measurement of the interface between the region A and the region B toward the direction perpendicular to the interface. As the measurement is headed from the layer of the region A composed of the dielectric ceramic composition to the region B of the other dielectric layer, the Al amount sharply increases nearly at the boundary. FIG. 12 shows the amounts of Nd, Ti and Ca which were measured similarly. Nd and Ca are elements which were not added to the other dielectric layer. These elements are detected in the region of the dielectric ceramic composition and in the concentrations nearly equal to the average amounts of these elements in the whole of the dielectric ceramic composition. By contrast, these elements are hardly detected in the other dielectric layer side.

The part where the elements in the both regions fluctuate is a diffusion layer, and the diffusion layer has a thickness of 20 µm or less in the boundary part. The diffusion layer of 20 µm or less, preferably 10 µm or less can provide an excellent multilayer dielectric substrate having both properties of an inorganic filler component and a low temperature sintering component.

A low temperature sintering component and an inorganic filler component were not separately produced by the calcination at different temperatures, and a dielectric ceramic composition was produced by directly firing the raw materials.

Raw materials were prepared so as to make compositions of the sample Nos. 2, 7, 14, 15 and 27 shown in Tables 3 and 4, and charged in a polyethylene ball mill. And, zirconium oxide media balls and pure water were further charged and wet mixed for 20 hours. After the obtained slurry was dried by heating, the dried slurry was disintegrated by a Raikai mixer, put in an alumina crucible, and calcined at 800° C. for 2 hours. The obtained calcined material was charged in the ball mill and wet pulverized for 17 hours, and thereafter, dried to obtain a fine powder having an average particle diameter of 1 µm.

Hereafter, a sintered body was produced in the same way as the case of the dielectric ceramic composition in which a mixed powder was obtained by separately calcining a low temperature sintering component and an inorganic filler component.

With respect to the dielectric constant of the sintered body, namely, the dielectric constant in the frequency range of 1 GHz to 5 GHz, the quality factor fQ in 1 to 5 GHz, the temperature coefficient $\tau_f$ of the resonance frequency in the temperature range of −20° C. to 60° C., the thermal expansion coefficient in the temperature range of 40 to 600° C., the sinterability, and the existence or non-existence of the crack and delamination (the composition of the high dielectric layer corresponding to the sample No. 14 in Tables 3 and 4) were examined. The results are shown in Table 8.

Besides the quality factor fQ, nearly the same values are shown as compared with a sintered body obtained by separately calcining a low temperature sintering component and an inorganic filler component at different temperatures. Since the quality factor fQ is likely to be slightly inferior, if a dielectric ceramic composition and a multilayer dielectric substrate having high properties are required, it is preferable to use a producing method of separately calcining the low temperature sintering component and the inorganic filler component at different temperature.

TABLE 8

| Sample No. | Inorganic Filler | Low Temperature Sintering Component | Filler Amount (wt %) | Dielectric Constant | fQ (GHz) | τf (ppm/° C.) | Thermal Expansion Coefficient (ppm/° C.) | Sinterability | Existence or Non-Existence of Crack and Delamination between Different Material Layers |
|---|---|---|---|---|---|---|---|---|---|
| 40(2) | F5 | G2 | 40 | 15 | 2000 | 20 | 6.2 | ○ | non-existence |
| 41(7) | F5 | G7 | 40 | 12 | 2000 | 10 | 6.3 | ○ | non-existence |
| 42(14) | F2 | G6 | 40 | 16 | 2000 | 90 | 6.3 | ○ | non-existence |

TABLE 8-continued

| Sample No. | Inorganic Filler | Low Temperature Sintering Component | Filler Amount (wt %) | Dielectric Constant | fQ (GHz) | τf (ppm/° C.) | Thermal Expansion Coefficient (ppm/° C.) | Sinterability | Existence or Non-Existence of Crack and Delamination between Different Material Layers |
|---|---|---|---|---|---|---|---|---|---|
| 43(15) | F3 | G6 | 40 | 15 | 3000 | 50 | 5.6 | o | non-existence |
| 5(27) | F16 | G6 | 40 | 13 | 3000 | 10 | 6.5 | o | non-existence |

DESCRIPTION OF REFERENCE NUMERALS 1 (Unsintered) Multilayer Dielectric Substrate
2a to 2d Green Sheet
3a to 3d Green Sheet
4 Electrode Pattern
5 Via Electrode

The invention claimed is:

1. A dielectric ceramic composition comprising an $ATiO_3$ (A is an element consisting of at least one of Ca and Sr) phase and an $AAl_2Si_2O_8$ phase,
wherein the dielectric ceramic composition comprises Al, Si, A and Ti as main components and further B as an additional element in the following ratio: with respect to 100 parts by weight of the whole of the dielectric ceramic composition, 11 to 25% by weight of the Al element in terms of $Al_2O_3$, 20 to 33% by weight of the Si element in terms of $SiO_2$, 5 to 30% by weight of the A element in terms of AO, 0.9 to 5% by weight and of the B element in terms of $B_2O_3$, and $TiO_2$ (containing inevitable impurities) as a remainder; and the dielectric ceramic composition has a dielectric constant of 10 or higher at 3 GHz and an average thermal expansion coefficient of lower than 7 ppm/° C. in the temperature range of 40 to 600° C.

2. The dielectric ceramic composition according to claim 1, wherein the A element consists only of Sr, and the Sr element in the whole of the dielectric ceramic composition is contained in the ratio of 5 to 30% by weight in terms of SrO.

3. The dielectric ceramic composition according to claim 1, wherein the dielectric ceramic composition uses Sr and Ca as the A element, and the Sr element in the whole of the dielectric ceramic composition is contained in the ratio of 5 to 15% by weight in terms of SrO, and the total amount of the Sr and Ca elements in the whole of the dielectric ceramic composition is 5 to 30% by weight in terms of AO.

4. The dielectric ceramic composition according to claim 2, comprising at least one of R (R is an element consisting of at least one of Nd, La and Sm), Mg and Zn, wherein the dielectric ceramic composition comprises, with respect to 100 parts by weight of the whole of the dielectric ceramic composition, 0.01 to 20% by weight of the R element in terms of $R_2O_3$, 0 to 10% by weight of the Mg element in terms of MgO, and/or 0 to 5% by weight of the Zn element in terms of ZnO.

5. The dielectric ceramic composition according to claim 2, comprising an element consisting of at least one of Na, K, Cu, Mn and Bi, wherein the dielectric ceramic composition comprises, with respect to 100 parts by weight of the whole of the dielectric ceramic composition, 0 to 4% by weight of the Na element in terms of $Na_2O$, 0 to 1% by weight of the K element in terms of $K_2O$, 0.1 to 3% by weight of the Cu element in terms of CuO, 0.1 to 3% by weight of the Mn element in terms of $Mn_3O_4$, and/or 1 to 5% by weight of the Bi element in terms of $Bi_2O_3$.

6. The dielectric ceramic composition according to claim 5, having an absolute value of a temperature coefficient $\tau_f$ of the resonance frequency in the temperature range of −20° C. to 60° C. of 120 ppm/° C. or lower.

7. The dielectric ceramic composition according to claim 2, comprising 0.1 to 3% by weight of Ag with respect to 100 parts by weight of the whole of the dielectric ceramic composition.

8. The dielectric ceramic composition according to claim 4, substantially comprising neither phase of an R-M-Ti—Si—O type (R is an element consisting of at least one of Nd, Sm and La; and M is an element consisting of at least one of Mg and Zn) nor phase of an A-Ti—Si—O type (A is an element consisting of at least one of Ca and Sr).

9. The dielectric ceramic composition according to claim 2, comprising at least one compound phase of $R_{2/3}TiO_3$ (R is an element consisting of at least one of Nd, La and Sm) phase and $M_2TiO_4$ (M is an element consisting of at least one of Mg and Zn) phase.

10. A multilayer dielectric substrate in which a plurality of dielectric layers forming a conductor(s) is integrally laminated, comprising:
at least one dielectric layer of the plurality of dielectric layers, wherein the at least one dielectric layer is composed of a dielectric ceramic composition according to claim 1; and
an other dielectric layer(s) comprising a dielectric ceramic composition having an $A'Al_2Si_2O_8$ phase (A' is an element consisting of at least one of Ca, Sr and Ba) and an $Al_2O_3$ phase, wherein the dielectric ceramic composition having the $A'Al_2Si_2O_8$ phase and the $Al_2O_3$ phase, comprises Al, Si, A' and Ti as the main components in the following ratio: with respect to 100 parts by weight of the whole of the other dielectric layer(s), 10 to 60% by weight of Al in terms of $Al_2O_3$, 25 to 60% by weight of Si in terms of $SiO_2$, 7.5 to 50% by weight of A' in terms of A'O, and 20% by weight or less (including 0) of Ti in terms of $TiO_2$, and as at least one selected from the group consisting of Bi, Na, K and Co as the accessory components in the following ratio: with respect to 100 parts by weight of the main components, 0 to 10% by weight of Bi in terms of $Bi_2O_3$, 0 to 5% by weight of Na in terms of $Na_2O$, 0 to 5% by weight of K in terms of $K_2O$ and/or 0 to 5% by weight of Co in terms of CoO, and additionally at least one selected from the group consisting of Cu, Mn and Ag in the following ratio: with respect to 100 parts by weight of the main components, 0 to 5% by weight of Cu in terms of CuO, 0 to 5% by weight of Mn in terms of $Mn_3O_4$ and/or 0 to 5% by weight of Ag, and substantially free of B element.

11. The multilayer dielectric substrate according to claim 10, wherein the other dielectric layer comprises 20.0 to 48.0% by weight of an Al amount in terms of in terms of $Al_2O_3$, 28.0 to 47.7% by weight of a Si amount in terms of $SiO_2$, 10.0 to 28.0% by weight of an A' amount in terms of A'O, and 20% by weight or less (including 0) of a Ti amount in terms of $TiO_2$.

12. An electronic component, comprising the multilayer dielectric substrate according to claim 10.

13. A method for producing the dielectric ceramic composition according to claim 1, comprising the steps of:
preparing raw materials essentially comprising Al, Si, Sr, Ti and B, and optionally at least one of Na, K, Cu, Mn, Bi and Ag, and calcining the prepared raw materials at 600° C. or higher and 850° C. or lower to obtain a low-temperature sintering component;
separately preparing raw materials essentially comprising the A element and Ti, and optionally at least one of Nd, La, Sm, Mg and Mn, and calcining the prepared raw materials at higher than 700° C. and 1,300° C. or lower to obtain an inorganic filler component; and
mixing the low-temperature sintering component and the inorganic filler component, and thereafter, firing the mixture at a temperature higher than the calcining temperature of the low-temperature sintering component and lower than the calcining temperature of the inorganic filler component.

14. The method for producing a dielectric ceramic composition according to claim 13, wherein the low-temperature sintering component comprises each of at least Al, Si, Sr and B, and a composition of the low-temperature sintering component after sintering comprises, with respect to 100 parts by weight of the whole of the low-temperature sintering component, 18 to 40% by weight of Al in terms of $Al_2O_3$, 35 to 58 parts by weight of Si in terms of $SiO_2$, 10 to 40% by weight of Sr in terms of SrO and 1.5 to 5% by weight of B in terms of $B_2O_3$.

15. The method for producing a dielectric ceramic composition according to claim 14, wherein the low-temperature sintering component comprises an element consisting of at least one selected from the group consisting of Na, K, Cu, Mn and Bi, and a composition of the low-temperature sintering component after sintering comprises, with respect to 100 parts by weight of the whole of the low-temperature sintering component, 0 to 5% by weight of Na in terms of $Na_2O$, 0 to 5% by weight of K in terms of $K_2O$, 0.01 to 5% by weight of Cu in terms of CuO, 0.01 to 5% by weight of Mn in terms of $Mn_3O_4$, and/or 0.1 to 5% by weight of Bi in terms of $Bi_2O_3$.

16. The method for producing a dielectric ceramic composition according to claim 14, wherein the low-temperature sintering component comprises Ag, and a composition of the low-temperature sintering component after sintering comprises, with respect to 100 parts by weight of the whole of the low-temperature sintering component, 0.5 to 6% by weight of Ag.

17. The method for producing a dielectric ceramic composition according to claim 13, wherein the inorganic filler component comprises each of at least A (A is an element consisting of at least one of Ca and Sr) and Ti, and a composition of the inorganic filler component after sintering comprises, with respect to 100 parts by weight of the whole of the inorganic filler component, 10 to 60% by weight of A in terms of AO and 30 to 60% by weight of Ti in terms of $TiO_2$.

18. The method for producing a dielectric ceramic composition according to claim 17, wherein the inorganic filler component comprises at least one of R (R is an element consisting of at least one of Nd, La and Sm), Mg and Zn, and a composition of the inorganic filler component after sintering a composition comprises, with respect to 100 parts by weight of the whole of the inorganic filler component, 0.01 to 50% by weight of the R element in terms of $R_2O_3$, 0 to 15% by weight of the Mg element in terms of MgO, and 0 to 10% by weight of the Zn element in terms of ZnO.

* * * * *